United States Patent [19]

Ishikawa et al.

[11] Patent Number: 5,418,815
[45] Date of Patent: May 23, 1995

[54] RECEIVER ADAPTIVELY OPERABLE FOR MULTIPLE SIGNAL TRANSMISSION SYSTEMS

[75] Inventors: Tatsuya Ishikawa; Noboru Taga, both of Kanagawa, Japan

[73] Assignee: Kabushiki Kaisha Toshiba, Kawasaki, Japan

[21] Appl. No.: 76,131

[22] Filed: Jun. 14, 1993

[30] Foreign Application Priority Data

Jun. 12, 1992 [JP] Japan .................................. 4-153475

[51] Int. Cl.⁶ ............................................. H04L 27/00
[52] U.S. Cl. ..................... 375/216; 375/321; 375/344; 455/142
[58] Field of Search ................... 375/5, 94, 39, 41, 54, 375/85, 43, 77, 78, 97; 329/357, 304, 315; 455/214, 142, 204

[56] References Cited

U.S. PATENT DOCUMENTS

| | | | |
|---|---|---|---|
| 4,750,214 | 6/1988 | Hart et al. | 375/800 |
| 4,852,086 | 7/1989 | Eastmond et al. | 375/5 |
| 4,882,725 | 11/1989 | Noda et al. | 370/20 |
| 5,063,445 | 11/1991 | Nishizawa et al. | 348/427 |
| 5,072,297 | 12/1991 | Kanazawa et al. | 348/738 |
| 5,163,159 | 11/1992 | Rich et al. | 375/5 |
| 5,251,232 | 10/1993 | Nonami | 375/5 |

FOREIGN PATENT DOCUMENTS

| | | |
|---|---|---|
| 0464328 | 1/1992 | European Pat. Off. . |
| 335673 | 2/1991 | Japan . |
| 398537 | 10/1991 | Japan . |
| 2238213 | 5/1991 | United Kingdom . |

Primary Examiner—Stephen Chin
Assistant Examiner—Tesfaldet Bocure
Attorney, Agent, or Firm—Cushman, Darby & Cushman

[57] ABSTRACT

A receiver for selectively receiving high frequency signals from analog modulated signals and digital modulated signals. The receiver has an intermediate frequency signal circuit for selecting a desired channel of the high frequency signals and for frequency-converting the high frequency signal of the selected channel into an intermediate frequency signal, a demodulator for demodulating the intermediate frequency signal, which is adapted to be capable of demodulating modulated signals in a variety of modulation systems, the demodulator including at least a digital section, and a controller for controlling the demodulator to be able to discriminate between the analog modulated signals and the digital modulated signals, based on a demodulated signal output from the digital section of the demodulator and to be switched into a demodulation mode suited for modulation system of the selected channel of the high frequency signals.

10 Claims, 15 Drawing Sheets

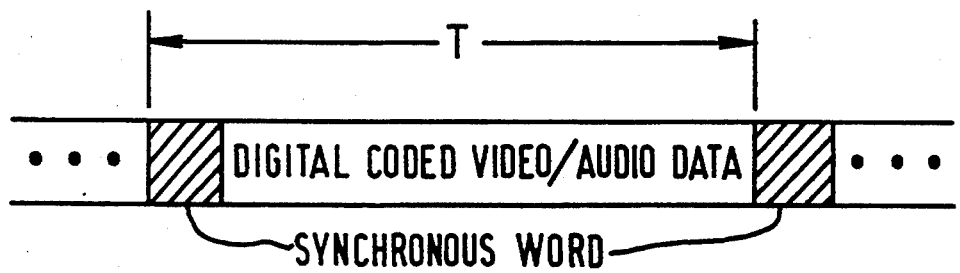
FIG. 7(A) TRANSMITTED DIGITAL DATA
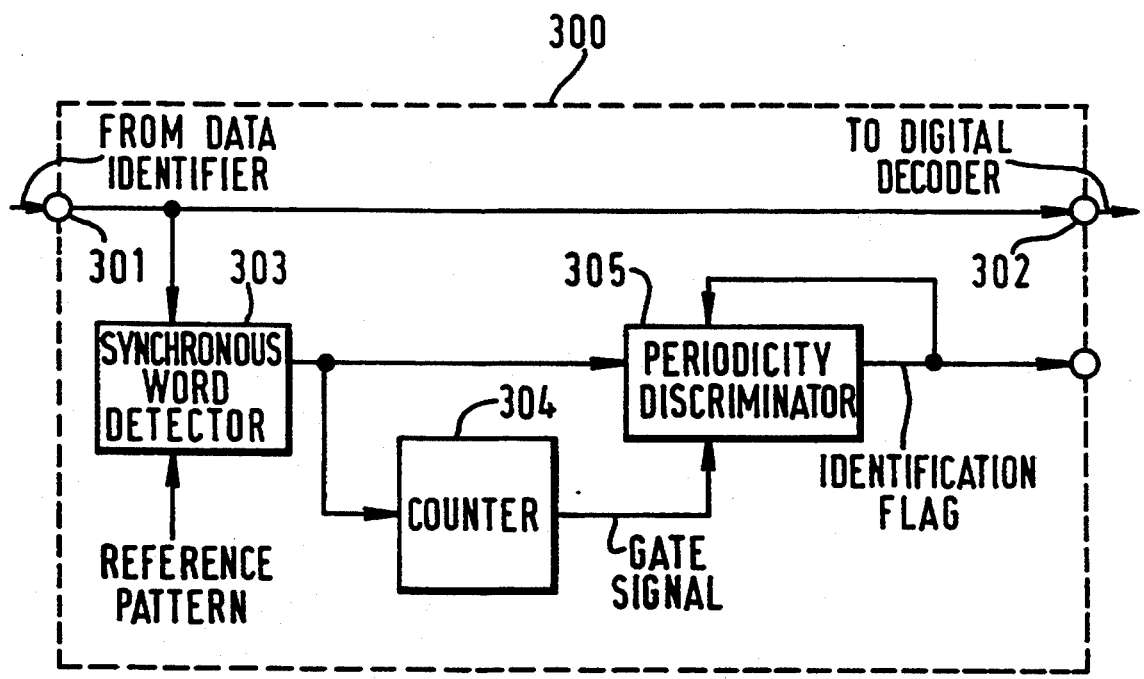
FIG. 7(B) DIGITAL MODULATION DISCRIMINATOR

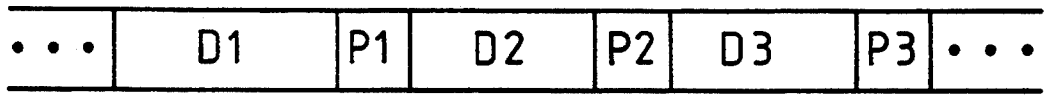
Dn : VIDEO/AUDIO INFORMATION DATA
Pn : INSPECTION DATA
FIG. 8(A) TRANSMISSION LINE CODING USING BLOCK CODE
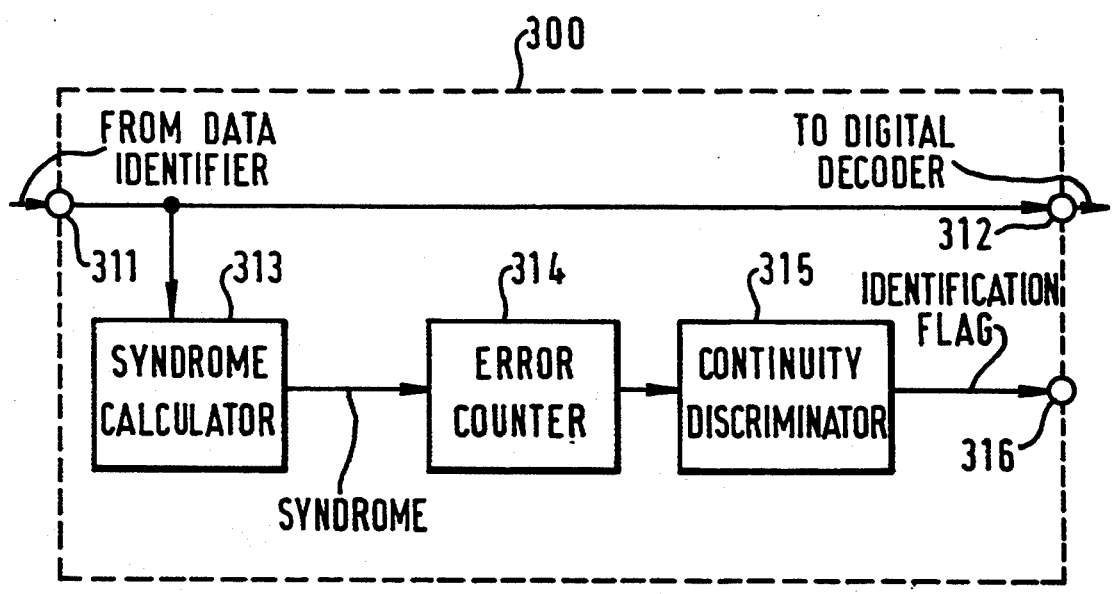
FIG. 8(B) DISCRIMINATOR FOR DIGITAL MODULATED SIGNAL USING BIT ERROR RATE

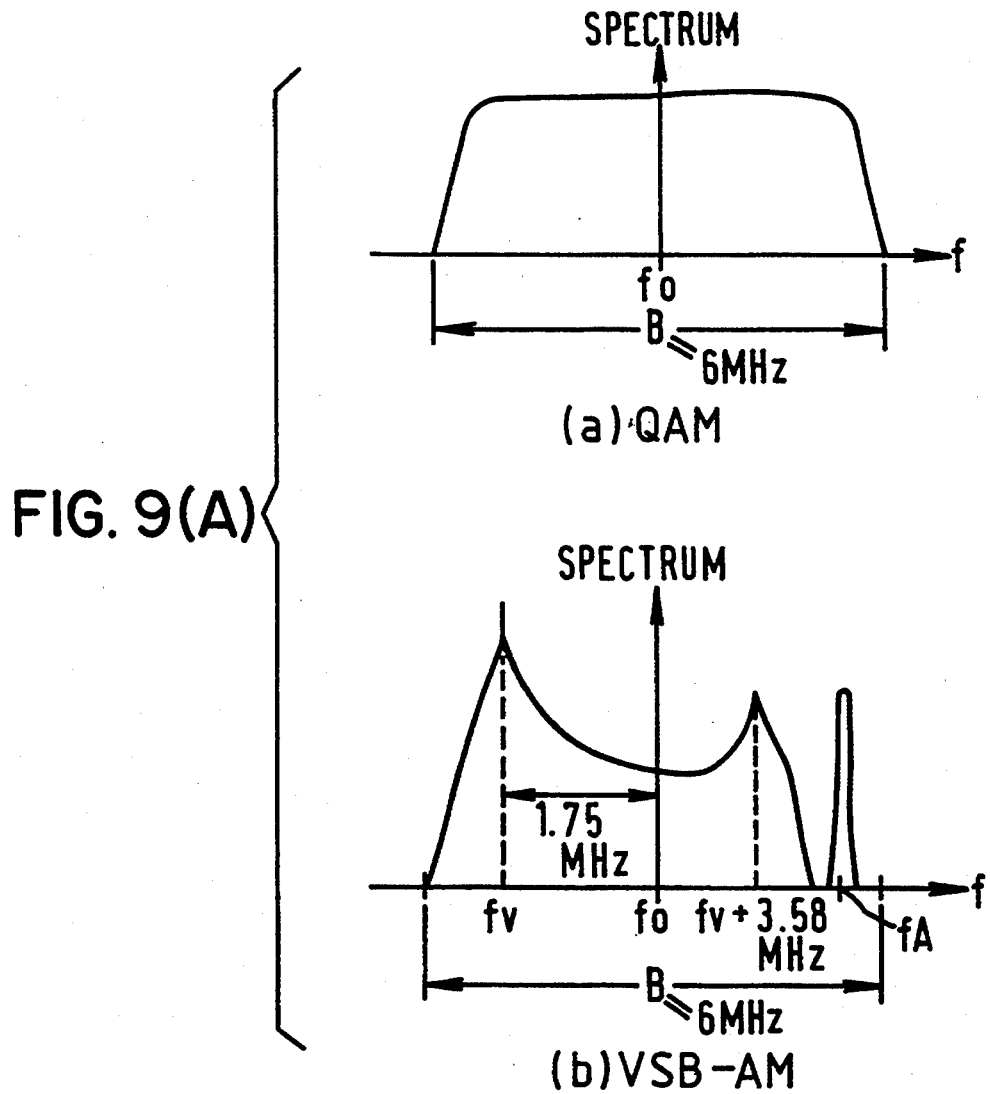
FIG. 9(A)
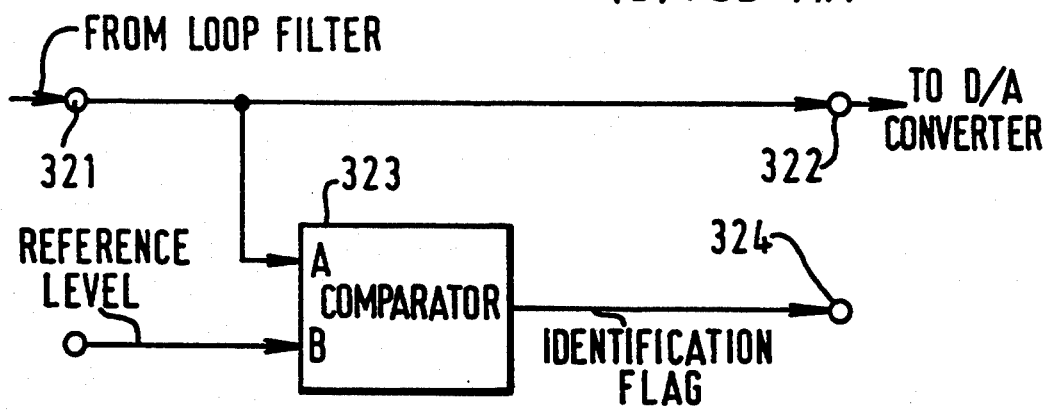
FIG. 9(B) DISCRIMINATOR FOR DIGITAL MODULATED SIGNAL USING CARRIER FREQUENCY DEVIATION

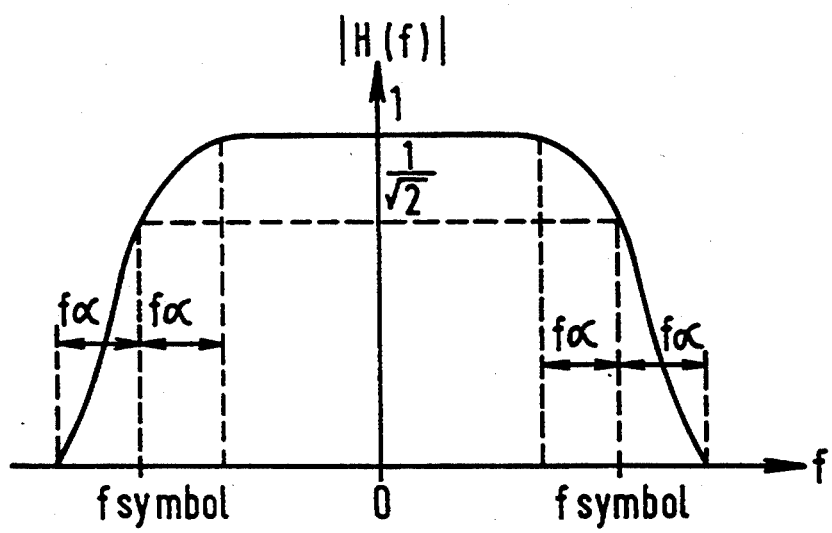
$f\alpha$ = ROLL-OFF RATE × fsymbol
FIG. 12(A) SPECTRUM SHAPING CHARACTERISTICS FOR QAM SIGNAL
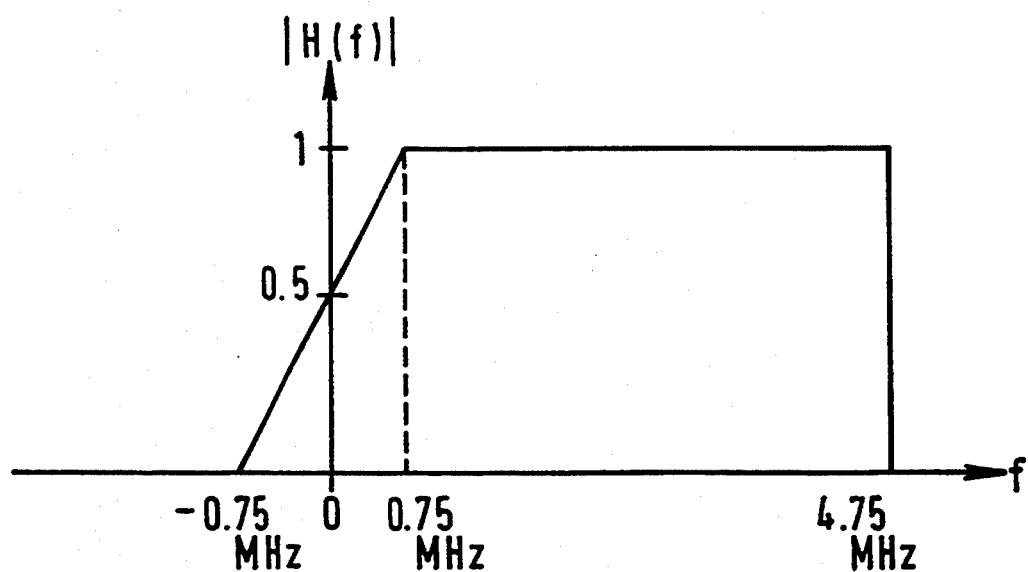
FIG. 12(B) SPECTRUM SHAPING CHARACTERISTICS FOR VSB-AM SIGNAL

RECEIVER ADAPTIVELY OPERABLE FOR MULTIPLE SIGNAL TRANSMISSION SYSTEMS

FIELD OF THE INVENTION

The present invention relates generally to a receiver adaptively operable for multiple signal transmission systems, and more particularly to such a receiver adapted for receiving video signals or audio signals.

BACKGROUND OF THE INVENTION

Conventionally, video or audio signals are transmitted according to an analog or a digital modulation system through a ground wave broadcasting path or a cable TV transmission path. Recently a satellite communication and a satellite broadcasting have been developed for transmitting the video signals or the audio signals.

In a system for transmitting video signals or audio signals through a ground wave broadcasting path or a cable TV transmission path, an analog vestigial sideband amplitude modulation (hereinafter referred to as VSB-AM modulation) system is widely used. In particular, the VSB-AM modulation system is exclusively used in the ground wave broadcasting path. This is because the frequency utilization efficiency of the VSB-AM modulation system is excellent in existing technologies available in this field.

The VSB-AM modulation system and a receiver associated with the VSB-AM modulation system will be described in detail, for instance, in a publication titled "Color TV Technology" published from Ohm Inc. in Japan, on Aug. 15, 1979. Principal features of the receiver described in the publication will be summarized below.

1) The VSB-AM modulation system is for the vestigial sideband transmission with a frequency spectrum left around a carrier frequency. Therefore, in order to get flat demodulated output in the entire band width, a spectrum shaping must be performed using a Nyquist filter that has a slope symmetrical to carrier frequency.

2) The demodulated output can be detected through, for example, an envelope detection. However in order to prevent distortions in demodulated signals, a synchronous detection is required.

FIG. 1 shows a block diagram of conventional VSB-AM modulation receiver. After amplified by an RF amplifier 801, a desired channel of an input signal is tuned by a tuner 802 and then the input signal converted into an intermediate frequency band signal (hereinafter referred to as IF signal). The IF signal passes through an automatic gain controller (hereinafter referred to as AGC) 803 and a Nyquist filter 807 and then branched into two paths. One of these branched signals is subject to a carrier regeneration at a carrier regenerator 808 which includes a PLL (phase-locked loop) etc., and then multiplied with the other branched signal at a mixer 809. The demodulation system for detection by the regenerated carrier frequency with a narrow band width regeneration characteristics is a synchronous detection, which has such a merit that no demodulation distortion is produced in principle in compared with an amplitude modulated envelope detection. The demodulated signal is output through the output terminal 811 after removed its harmonic components and noises by a low-pass filter (hereinafter referred to as LPF) 810.

The tuner circuit 802 is capable of obtaining stable local oscillation frequency by using, for instance, a frequency synthesizer. However, since the frequency of the input signal itself is generally not stable, there is a possibility of causing a frequency detuning. For instance, since relatively inexpensive RF modulators as used in many VTRs (video tape recorders) do not necessarily have a stable frequency characteristics, an automatic frequency control (hereinafter referred to as AFC) loop comprising a frequency error ($\Delta f$) detector 804 is provided in tuner circuits of ordinary receivers, as shown in FIG. 1, so as to suppress the frequency detuning in front of the Nyquist filter 807. The frequency error signal $\Delta f$ obtained by the $\Delta f$ detector 804 is supplied to a frequency control terminal of a local oscillator 805.

In recent years, a digital ground wave broadcasting system and a digital cable transmission system were developed for transmitting digital video or audio signals through a path having the same transmission band width as that of conventional analog transmission systems, through direct digital modulation of signals after encoding them at a high efficiency coding. Such systems have a feature that they are capable of transmitting much more information than the conventional analog modulation system as described above and are free from an affect of transmission noises or the like, and are thus expected that they will be extensively used in the future.

As a digital modulation system used for the digital broadcasting, a quadrature amplitude modulation (hereinafter referred to as QAM) which is widely used in the communication field is considered to be the most general modulation system. With a multivalued QAM, such modulations as 16QAM, 32QAM, 64QAM and 256QAM are proposed and are put to practical use.

Demodulators of the modulation system are conventionally put into practical use mostly in digital microwave circuits and are seen, for instance, in a paper titled "Construction and Characteristics of 16QAM Carrier Regenerator Retaining Mode Switching Function" by MATSUE et al., in the "Electronic Communication Society Paper", 1985/3, vol. J68-B, No. 3.

FIG. 2 shows the conventional general multivalued QAM demodulator. The QAM signal input to an input terminal 830 is amplified and tuned by an RF (high frequency) amplifier 831, a tuner 832, a local oscillator 833 and an AGC amplifier 834 similarly to those illustrated in FIG. 1, and then converted to an IF signal. The IF signal is supplied to a quadrature detector 835 wherein the IF signal is branched into an in-phase detector 836 and a quadrature-phase detector 837. A local oscillation signal generated from a local oscillator 838 is supplied to the in-phase detector 836 as a 0° phase local oscillation signal and is supplied to the quadrature-phase detector 837 as a 90° phase local oscillation signal via a 90° phase shifter 839. The outputs from the detectors 837 and 836 are supplied to low-pass filters (LPFs) 841 and 842, respectively, which have the same frequency transfer characteristics for spectrum shaping. The LPFs 841 and 842 have the transfer characteristics demanded for preventing an inter-symbol interference in the digital data transmission path and are designed to form a so-called roll-off characteristics over a transmitting section and a receiving section in many cases. Therefore, in the outputs of the LPFs 841 and 842, an eye opening rate is made sufficiently large and are converted to digital values at the timing of the center of the eye opening in A/D converters 843 and 844. As the digitized demodulated outputs have a symbolic amplitude on the in-phase axis and a quadrature-phase axis, it is possible for a data identifier 845 to identify each symbol from the digitized demodulated output.

Further, the eye opening centered timing clock is produced in a clock regenerator 846. In addition, in the data identifier 845, the phase of transmitted symbols is detected from amplitudes of symbols on the in-phase axis and the quadrature-phase axis and then fed back to the local oscillator 838 as a phase error signal of a carrier regenerator, a type of PLL circuits, via a loop filter 847 and a D/A converter 848, thus achieving a phase synchronization between the input signal and the regenerated carrier signal.

Now, assuming a receiver that is commonly usable to an analog modulated signal and a digital modulated signal, as shown in FIGS. 1 and 2, a receiver having another configuration, as shown in FIG. 3, can be conceived. The elements up to the element for generating the IF signal they are identical to those in the above configuration (e.g., FIG. 1) so that explanations therefor will be omitted hereinafter. The IF signal is supplied to both an analog modulated signal demodulator 851 and a digital modulated signal demodulator 852. Then, after processed pertinently in the demodulators 851 and 852, the outputs of these demodulators 851 and 852 are supplied to a signal processor 853 and a digital decoder 854. The outputs from the signal processor 853 and the digital decoder 854 are supplied to a switch 855, thus a pertinent signal is selected by the switch 855 and then led to an output terminal 856. The switch 855 changes over when a change-over signal is provided to the switch 855 by an operator, from an operation unit via a terminal 857.

Conventionally, for instance, a VSB-AM modulation, a type of analog modulations, and a QAM modulation, a type of digital modulations, have been used in separate transmission systems, respectively. So that there was no transmission or broadcasting system in which these two types of modulations are mixed together in use. However, as a result of the recent development of the digital transmission technology as described above, it has become possible to use the QAM modulation, even in a transmission system or a broadcasting system in which the VSB-AM modulation has been conventionally used. As a result, with the widespread use of the digital transmission systems, the state in which both modulation systems are used is expected and receivers adaptive to both modulation systems will be demanded in the future.

In the arrangement as described above, however, each of the analog and digital demodulators is independent and thus users must know in advance a modulation system by which a signal is transmitted or broadcasted, and then select an adequate demodulator. However, the type of the modulation system is not interested for users or it will obstruct the widespread use of receivers to force users the selection between the modulation systems.

If it is attempted to incorporate an analog demodulator and a digital demodulator together, different demodulators must be provided. And if these modulation systems are used for the transmission or the broadcasting system together, two types of demodulators must be provided. That is, the receiver antenna, the RF amplifier, frequency converter, etc. can be commonly used for both the modulation systems, but either type of demodulator cannot be used for both the modulation systems. Therefore, there is a problem of reducing costs of the receivers.

On the other hand, an analog frequency modulation (hereinafter simply referred to an FM modulation) is mainly used in a satellite transmission system of video signals or audio signals. In particular, in a satellite broadcasting system the FM modulation is generally used as its modulation system and is also used as broadcasting systems at many countries as well as Japan. This is because the FM modulation is excellent in the S/N properties after demodulated when compared with amplitude modulation, etc.

An example of conventional FM demodulators is described in detail in a book titled "Comprehensible FM Technology" by Yuya ITOH and Akira FUJII, published by Sanpo Shuppan Inc., in 1968. Typical components of the FM demodulator include a double tuner and a PLL (phase synchronization loop) which is adopted by many FM demodulators available on the market at present.

FIG. 4 shows an example of the FM demodulator employing such a conventional PLL circuit. In the diagram, the PLL circuit is illustrated in a simple fashion in order to make the explanation easy. In the diagram, an FM signal converted to an IF signal at a frequency converter 901 in order to facilitate detection is supplied to a phase detector 902. The phase detector 902 multiplies the output of a voltage control oscillator 903, which will be described later, by the input FM signal and outputs the result of the multiplication to a loop filter 904. The loop filter 904 removes higher harmonic components of the phase detection output, and also removes undesired noise component. The output from the loop filter 904 is supplied to the frequency control input terminal of the voltage control oscillator 903 for resulting a configuration of a PLL. In the state where the PLL is operating normally, the output of the loop filter 904, that is, the input to the voltage control oscillator 903 changes following instantaneous frequency of input FM signal. Therefore, if the signal is taken out, an FM demodulated output is obtained.

Further, to compensate a frequency detuning of the transmission system which generally exists, an automatic frequency control (AFC) is used. If the FM signal is being transmitted in such a manner that its average frequency becomes specified, the AFC in the FM modulation obtains a average frequency of the FM signal at the receiving side and if the average frequency is out of a specified value, the AFC controls local oscillation frequency of a frequency converter (for instance, the frequency converter 901) so that its output will have the specified average frequency.

In recent years, a satellite communication or a satellite broadcasting which is to digitally transmit digital video or audio signals by digitally modulating signals directly is proposed. This system has such features that the signals are free from transmission noises when compared with the FM modulation and is expected to widely spread in the future.

As the digital modulation to be used for the digital satellite broadcasting, a quadrature phase modulation (or quadrature phase shift keying (hereinafter referred to as QPSK modulation), which is extensively used in the field of communication, is expected to become a typical modulation system. Many demodulators in the modulation system are conventionally put to practical use as seen in, for instance, a paper titled "Development of Digital Demodulation LSI for Satellite Communication" by Yagi and others, that is disclosed in the Autumn National Meeting of electronic Information Communication Society (1990). FIG. 5 shows a conventional QPSK demodulator made on an integrated circuit for improving its performance by using a digital circuit.

The QPSK modulated signal received on an input terminal 921 is branched into an in-phase detector 922 and a quadrature-phase detector 923. Local oscillation signals supplied to the detectors 922 and 923 are 0° and 90° phase local oscillation signals branched from a fixed frequency output of a local oscillator 925 by a distributer 924. The detection outputs from the detectors 922 and 923 are supplied to analog-digital (A/D) converters 926 and 927 and then converted into digital values, respectively. Further, the digitized detection outputs are supplied to a complex multiplier 928. On the other hand, sine and cosine characteristics signals are supplied to the complex multiplier 928 from a sine converter 938 and a cosine converter 939 which will be described later, and wherein a complex multiplication is carried out. The complex multiplier 928 is capable of realizing completely the same operation as those in a frequency converter in the intermediate frequency band, i.e., a mixer. The result of complex multiplication is supplied to digital low-pass filters 931 and 932 having the same frequency characteristics for spectrum shaping. These digital low-pass filters 931 and 932 have transmission characteristics demanded for preventing an inter-symbol interference in the digital data transmission and are generally so designed that a so-called roll-off characteristics are obtained when combined with filter characteristics in a transmitter side. Therefore, the detection outputs of the digital low-pass filters 931 and 932 are spectrum shaped so that the eye opening rate is made sufficiently large.

The outputs from the digital low-pass filters 931 and 932 are branched and one of the branched outputs in supplied to a clock regenerator 933 while another output is supplied to a phase detector 934, where a phase error from a reference phase is detected. The phase error detection output (phase error information) from the detector 934 is supplied to a data discriminator 935. The data discriminator 935 discriminates QPSK data from phase information, that is, demodulates and outputs therefrom the QPSK data.

The phase error information from the phase detector 934 is supplied to the frequency control terminal of a numerical control oscillator (NCO) 937 via a loop filter 936 for regenerating the carrier frequency for a synchronous detection. The numerical control oscillator 937 includes a cumulative adder which does not inhibit an overflow and performs the adding operation up to a dynamic range corresponding to a signal value supplied to the frequency control terminal. Therefore, the numerical control oscillator 937 is put into an oscillating state wherein the oscillation frequency is changed by a numerical value of a control signal. The output of the numerical control oscillator 937 is branched into two parts and then supplied to a sine converter 938 and a cosine converter 939, respectively. The outputs of these converters 938 and 939 are supplied to the complex multiplier 928. The loop thus formed hereinabove construct a PLL in a complete digital fashion.

The demodulator described above in not considered a counterplan against a frequency detuning occurring in the transmission system, and therefore an AFC loop additionally required for preventing such a frequency detuning.

The FM modulation, a type of analog modulations, and the QPSK modulation, a type of digital modulations, are conventionally used in independent transmission systems, respectively. And there was no transmission or broadcasting system in which both modulation systems are mixed together in use. However, with the recent development of the digital transmission technology as described above, it has become possible to use the QPSK modulation in the transmission and broadcasting systems conventionally employing the FM modulation. So, it is expected that the state where both modulation systems are mixed together in use will come in the future.

However, even when both the modulation systems exist in the mixed state, two problems will occur as discussed below.

1) When the modulation systems are independent from each other, users must be aware of which modulation system is used for the transmission or the broadcasting, and then select an adequate modulator. For users, what kind of modulation system is used is not of interest and it will impede widespreading use to force users to make the selection of modulator.

2) Since both the FM demodulator and the QPSK demodulator are independent from each other as described above, therefore if these demodulators are used in the mixed state in the transmission or the broadcasting, it is necessary to provide both the demodulators for use in combination.

If the VSB-AM signal, a type of analog modulated signals, and the QAM signal, a type of digital modulated signals, are present in the mixed state in a ground wave broadcasting path or a cable TV transmission path as described above, users must be aware of what kind of modulation system is used for signals being received and it becomes necessary to change over demodulators and this will make it troublesome to receive signals adequately.

In addition, if a plurality of independent demodulators are provided for adaptively receiving signals of respective modulation systems, the entire receiver will become large and expensive.

Further if the FM signal and the QPSK modulated signal are mixed together in use in a satellite communication and a satellite broadcasting, at least two modulators must be provided in correspondence with both modulation systems. In such a case, users must be aware of what kind of modulation system is used for signals being received in advance and it becomes also necessary to change over demodulators for use and this will make it inconvenient to use receivers.

Furthermore, if receivers which are capable of receiving different modulated signals are simply combined, the assembly will become very expensive.

SUMMARY OF THE INVENTION

It is, therefore, an object of the present invention to provide a receiver adaptively operable for multiple signal transmission systems.

Another object of the present invention is to provide a receiver which is capable of receiving signals by automatically discriminating between both kinds of modulated signals even when analog and digital modulated signals are mixed together in use in a ground wave TV broadcasting system and a cable transmission system.

Still another object of the present invention is to provide a receiver which is capable of receiving signals by automatically discriminating between both kinds of modulated signals even when an Fm signal and QPSK modulated signal are mixed together in use in a satellite transmission system or a satellite communication system in easy to operate.

Still another object of the present invention is to provide a receiver which is available at a low cost.

In order to achieve the above object, a receiver adaptively operable for multiple signal transmission systems according to one aspect of the present invention has an intermediate frequency signal circuit for selecting a desired channel of the high frequency signals and for frequency-converting the high frequency signal of the selected channel into an intermediate frequency signal, a demodulator for demodulating the intermediate frequency signal, which is adapted to be capable of demodulating modulated signals in a variety of modulation systems, the demodulator including at least a digital section, and a controller for controlling the demodulator to be able to discriminate between the analog modulated signals and the digital modulated signals, based on a demodulated signal output from the digital section of the demodulator and to be switched into a demodulation mode suited for modulation system of the selected channel of the high frequency signals.

A receiver adaptively operable for multiple signal transmission systems according to another aspect of the present invention has a detector for detecting peculiar information appearing in demodulated outputs or in a phase locked loop for carrier generation, etc, at a reception of digital modulated signals, and a selector for automatically selecting and changing over to a demodulator adapted to the modulation system of the received signal based on the output information of the detector.

A receiver adaptively operable for multiple signal transmission systems according to still another aspect of the present invention has a frequency converter for performing quadrature-phase synchronous detection for converting the input modulated signal into baseband frequency, a complex filter for performing spectrum shaping of complex baseband signals which are detected outputs of the frequency converter according to respective modulation systems, and a complex multiplier for regenerating signals by multiplying the output of the complex filter by regenerated carrier frequency.

A receiver adaptively operable for multiple signal transmission systems according to still another aspect of the present invention has a quadrature-phase synchronous detector for performing the quadrature-phase synchronous detection of input modulated signal by an output of a local oscillator, a phase detector for detecting a phase error between the detected output of the quadrature-phase synchronous detector and a specified phase, a first loop filter into which the phase error output is input, a connection for providing the output of the first loop filter to the local oscillator, a frequency detector for detecting a frequency from the phase error output, a second loop filter for receiving frequency detection output of the frequency detector, an AFC loop for suppressing frequency detuning of signals supplied to the phase detector with the output from the second loop filter, a circuit for obtaining an FM demodulated output from the frequency detection output, a detector for detecting digital modulated data from the phase detection output, and a discriminator for discriminating which one of the digital demodulated signal and the FM signal is being supplied to the quadrature-phase synchronous detector.

The demodulation processing mode of the receiver is automatically changed over according to a modulation system of signals being received, making it convenient to operate the receiver.

Further, as the complex filter is provided at the front stage of the signal regenerator, it becomes possible to obtain a Nyquist filter characteristics in processing the VSB-AM signal and to realize route distributed roll-off characteristics over a transmitter side and a receiver side in processing the QAM signal, obtaining filter characteristics adapted to input modulated signal, without causing any distortion and a deterioration of bit error rate in subsequently regenerated signals, and the circuit elements up to the complex multiplier can be used commonly for respective modulation systems.

Further, since the frequency converter using oscillation signal from the oscillator which is incorporated in the AFC loop acts at the front stage of the complex filter to remove frequency deviation between signals and filters in advance before spectrum shaping, a frequency deviation of input signals is automatically suppressed and the spectrum shaping becomes to adapt to respective modulated signals, and the possibility for realizing the communication can be increased.

Furthermore, since a frequency detection is further carried out from phase detection output for the demodulation of the digital modulated signal, and then the demodulated signal from the FM signal is obtained from the frequency detection output, it is possible to make the receiver have many common elements corresponding respective modulation types of the digital modulated signal and the FM signal.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

For a better understanding of the present invention and many of the attendant advantages thereof, reference will now be made by way of example to the accompanying drawings, wherein:

FIG. 7(A) is a diagram showing an example of the transmission signal format according to the present invention and FIG. 7(B) is a diagram showing a definite example of the digital modulation discriminator;

FIG. 8(A) is a diagram showing another example of the transmission signal format according to the present invention and FIG. 8(B) is a diagram showing an example of the digital modulation discriminator 300 in FIG. 6;

FIG. 9(A) is a diagram showing an example of the spectrum of the transmission signal according to the present invention and FIG. 9(B) is a diagram showing another example of the digital modulation discriminator 300 in FIG. 6;

FIGS. 12(A) and 12(B) are explanatory diagrams showing the spectrum shaping characteristics of the transmission signal according to the second embodiment of the receiver;

DESCRIPTION OF THE PREFERRED EMBODIMENT

The present invention will be described in detail with reference to the FIGS. 6 through 15. FIGS. 6 through 10 show a first embodiment of the receiver adaptively operable for multiple signal transmission systems according to the present invention will be described in detail.

Figure 1:
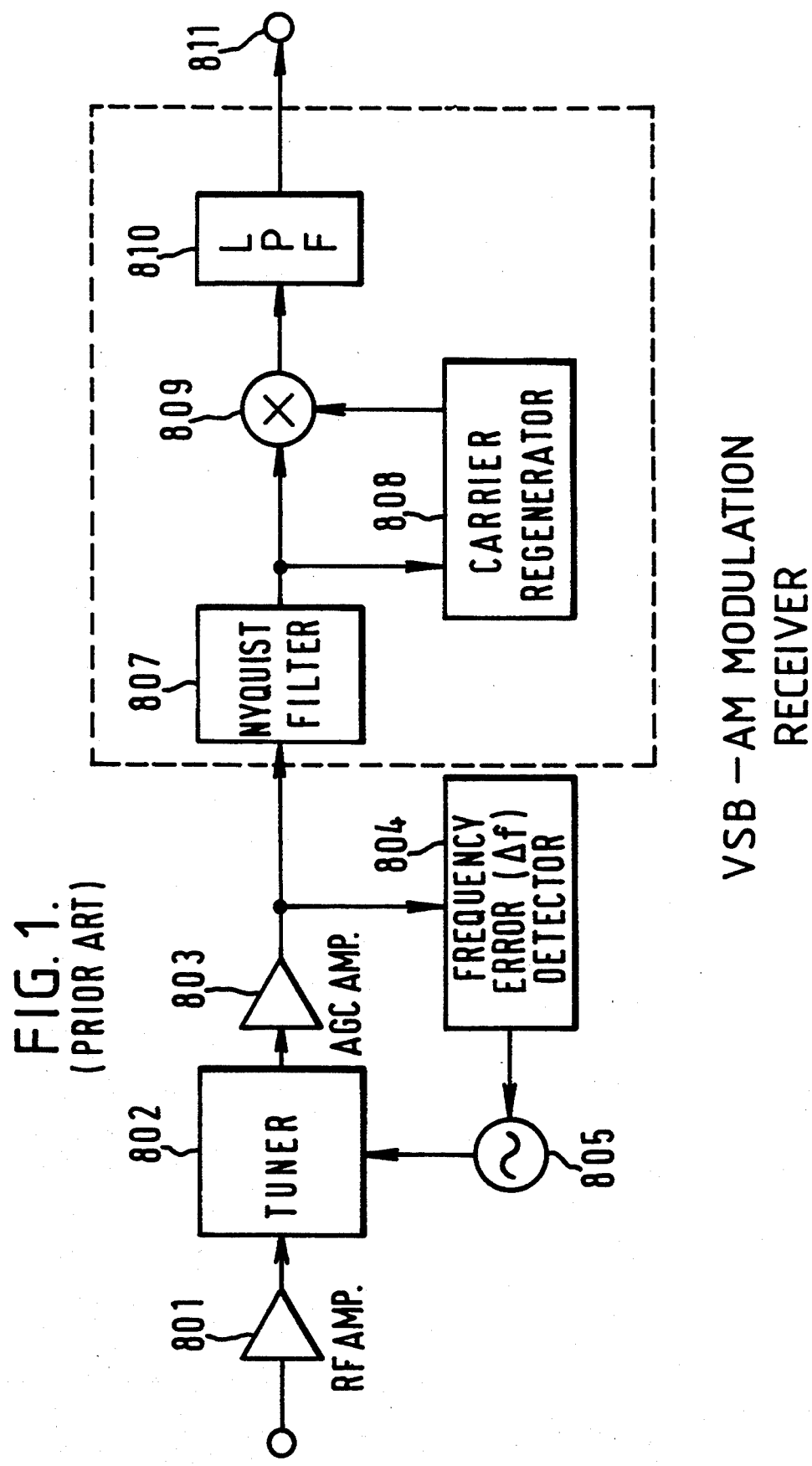
FIG. 1 is a diagram showing a conventional VSB-AM signal receiver.
Figure 2:
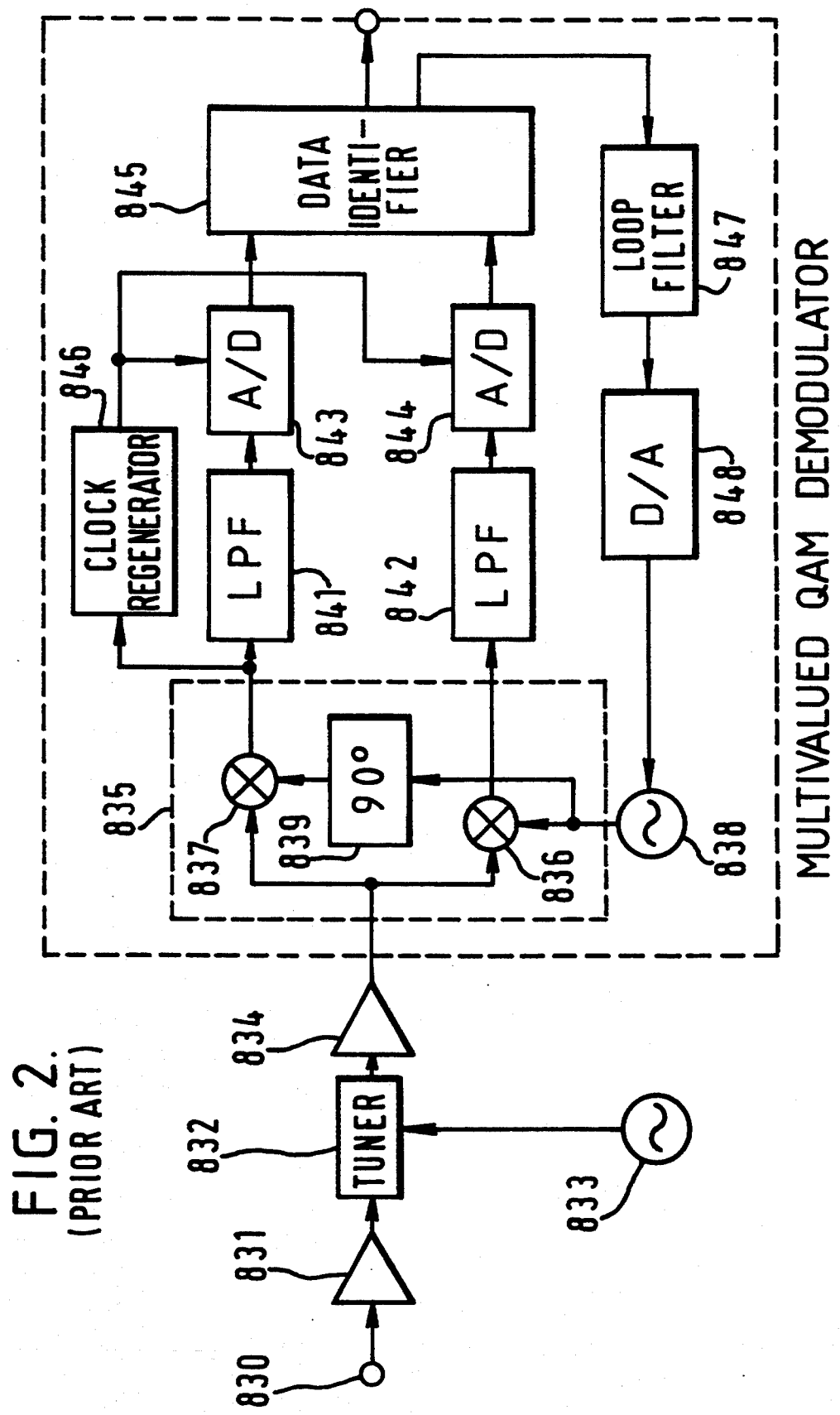
FIG. 2 is a diagram showing a conventional multiple QAM demodulator.
Figure 3:
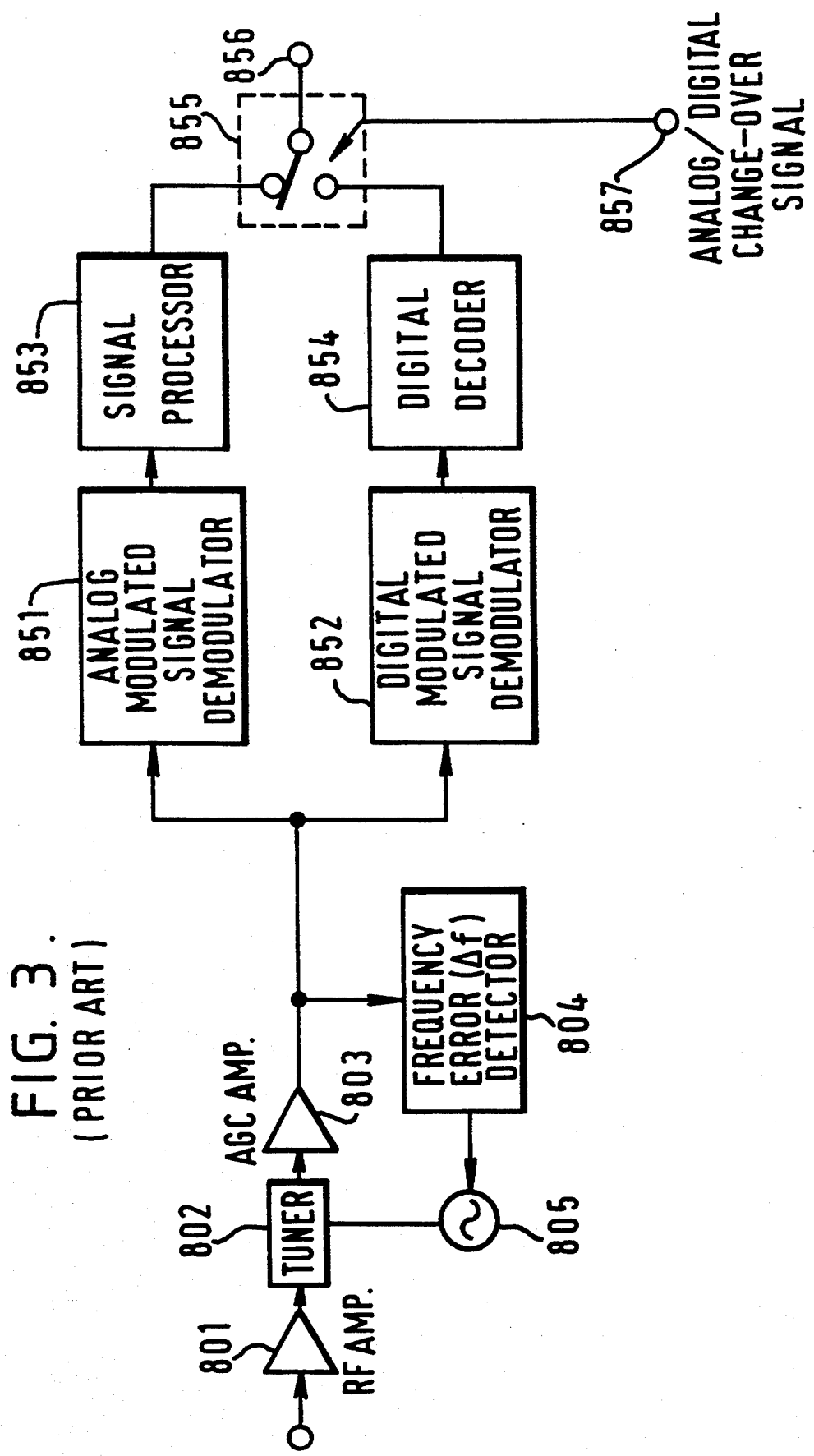
FIG. 3 is a diagram showing a conventional receiver adaptive to multiple signal transmission systems.
Figure 4:
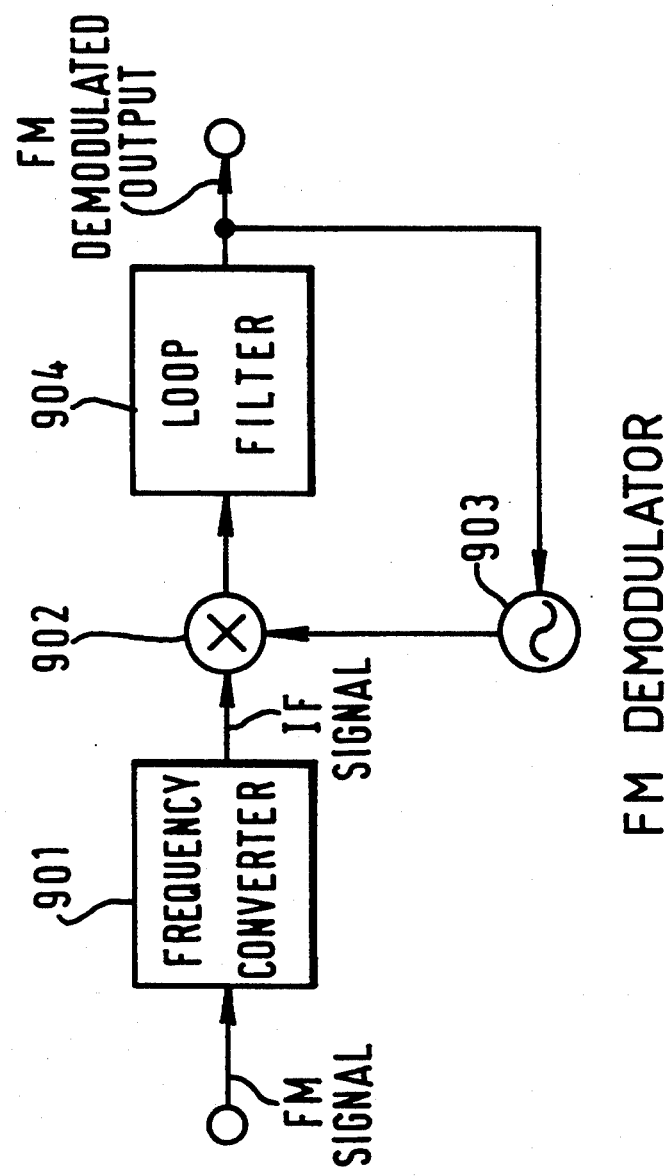
FIG. 4 is a diagram showing a conventional FM demodulator.
Figure 5:
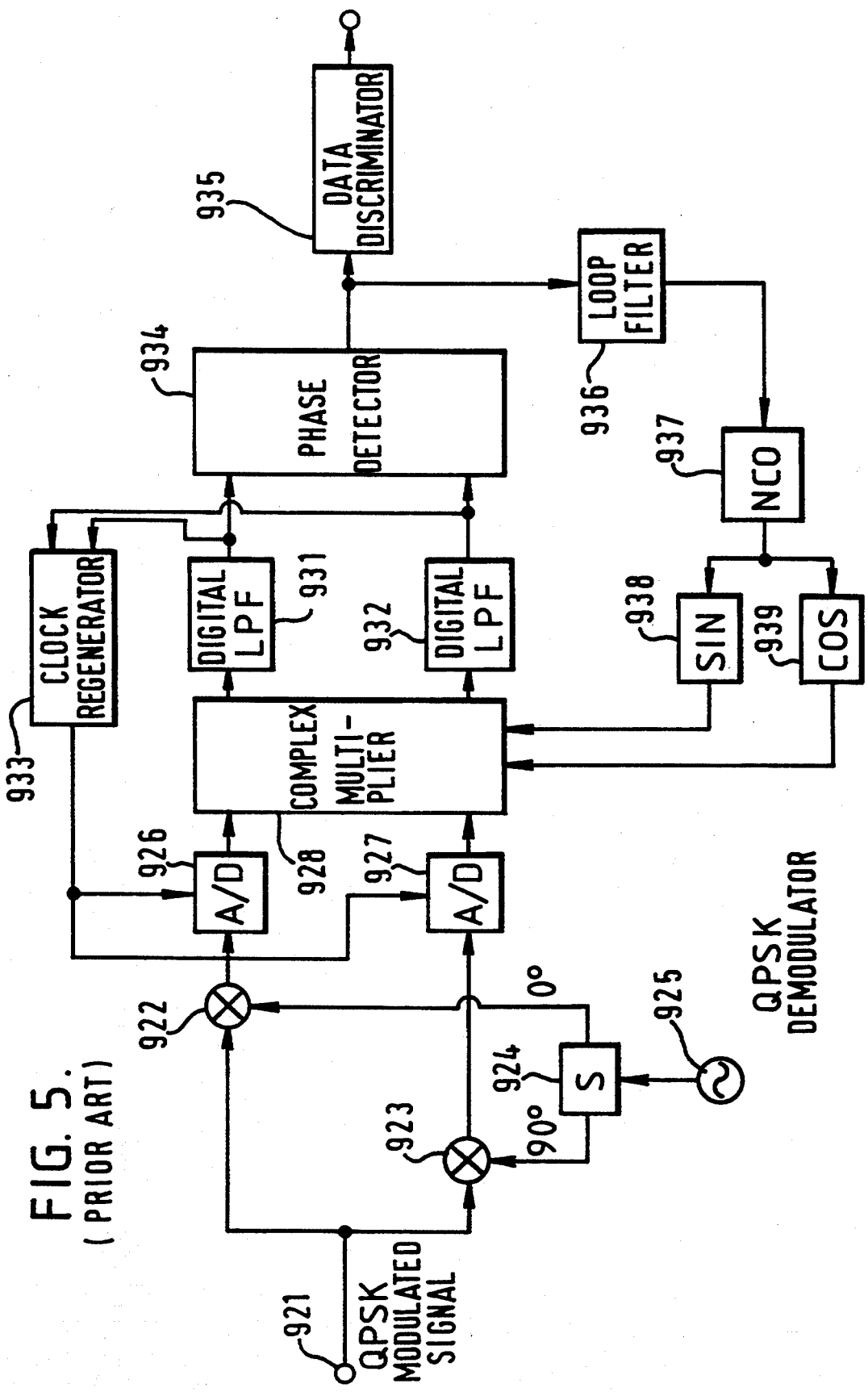
FIG. 5 is a diagram showing a conventional QPSK demodulator.
Figure 6:
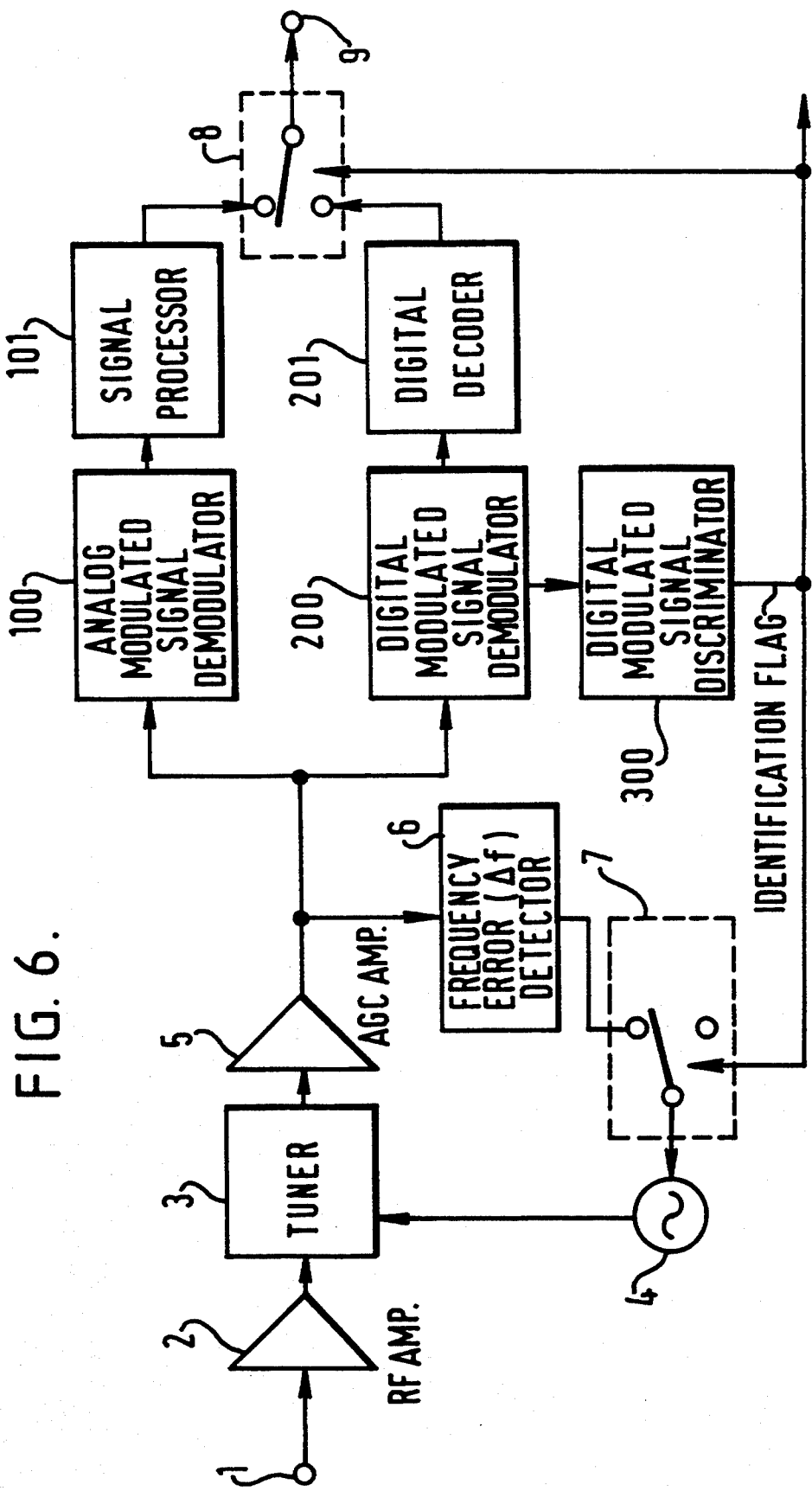
FIG. 6 is a block diagram showing a first embodiment of the present invention.

FIG. 6 shows an embodiment of the present invention. A high frequency signal (RF signal) is supplied to an input terminal 1, and amplified by an RF amplifier 2 and then supplied to a tuner 3. In the tuner 3, a tuning operation is performed using a local oscillation signal from a local oscillator 4 thus an intermediate frequency signal (IF signal) which is output from the tuner 3 is controlled for its gain by an automatic gain control (AGC) amplifier 5. The IF signal which is output from the AGC amplifier 5 is supplied to a frequency error ($\Delta f$) detector 6 and also, to an analog modulated signal demodulator 100 and a digital modulated signal demodulator 200.

The frequency error ($\Delta f$) detector 6 detects a frequency error of an IF signal. The frequency error information is used as an oscillation frequency control signal of the local oscillator 4 via a switch to stabilize the IF signal. The frequency control of the local oscillator 4 is effective only when analog modulated signals are received, and at a reception of analog modulated signals a switch 7 is turned ON to establish a loop. This is because some of analog modulated signals may have poor frequency stability like an RF modulator output of VTRs. This kind of frequency control is also performed in general TV sets. The output of the analog modulated signal demodulator 100 is processed at a signal processor 101 and supplied to one of the two input terminals of a switch 8, while the output of the digital modulated signal demodulator 200 is decoded at a digital decoder 201 and supplied to another switch 8. The switch 8 selects an adequate demodulated output based on a control signal which will be described below and leads it to an output terminal 9.

A digital modulated signal discriminator 300 is connected to the digital modulated signal demodulator 200. The digital modulated signal discriminator 300 discriminates whether the signal in the digital modulated signal demodulator 200 is normal, and if normal it discriminates that the current input signal includes digital modulated signals, turns OFF the switch 7, and controls the switch 8 to select the output of the digital decoder 201. When the signal currently received is discriminated not to include a digital modulated signal, the digital modulated signal discriminator 300 turns ON the switch 7 and controls the switch 8 to select the output of the signal processor.

As being designed in such a structure as described above, the receiver according to the present invention is capable of operating/stopping a frequency control loop automatically and also is capable of selecting an adequate demodulator output, and therefore the receiver can be used conveniently.

Now, four examples of the digital modulated signal discriminator 300 will be described below.

As shown in FIG. 7(A), the digital modulated signal discriminator 300 is based on the assumption that a synchronous word which is periodically (at a period T) appearing and has a less correlation with other data is inserted at a digital coded video or audio data sequence. And when the synchronous word is detected, the input signal is determined to include the digital modulated signal. If the input signal contains the digital modulated signal, it means that a synchronous word appears periodically in its demodulated output and if it does not appear, it may be determined that any specified digital modulated signal is not received. That is, an analog modulated signal is being received.

FIG. 7(B), shows a detailed arrangement of the digital modulation discriminator 300. To the input terminal 301, the demodulated output (output from a date identifier) from the digital modulated signal demodulator 200 is introduced. The signal introduced into the input terminal 301 is supplied to the digital decoder 201 through an output terminal 302, and also supplied to a synchronous word detector 303, which detects a synchronous word contained in the demodulated output by comparing the demodulated output with the reference pattern (the synchronous word pattern). The detection is carried out by using a pattern correlating device and the like. If there is no transmission bit error due to noises and the like, the detection output is obtained accurately at a periodic interval. However, as there occurs some bit errors in general, the final determination is carried out after confirming the periodicity of the detection output. In other words, when a synchronous word is detected, the synchronous word detector 303 outputs a detection pulse and supplies it to a counter 304 and a periodicity discriminator 305. The counter 304 predicts the periodic arrival of the synchronous word, generates a gate pulse at the predicted timing and permits the discrimination by the periodicity discriminator 305. Further, the discrimination has a hysteresis characteristics, and therefore the output of the periodicity discriminator 305 is fed back.

In the above embodiment, an example using a synchronous word that is periodically transmitted will be described. However, it is not necessarily needed to transmit a synchronous word periodically. In such a case, the discrimination may be carried out by confirming that no synchronous word is detected while observing for a fixed period.

The embodiment of the digital modulated signal discriminator 300, as shown in FIG. 8, shows an arrangement for discriminating whether the input signal includes digital modulated signal by using the property of transmission line codings, i.e., error correction codings in the digital data transmissions. That is, FIG. 8(A) shows a video or audio information data (Dn) in the digital transmission and an inspection data (Pn) in the block coding. In the digital data transmission, the inspection data (Pn) for error correction is added as shown here. The transmission error rate does not exceed the range of the code correction region sharply even in the normal receiving state. So, the number of error bits per block demanded in decoding may be regarded to express almost bit errors in that transmission state. If a specified digital modulated signal with specified transmission line codings is input in the normal receiving state, the error bits per block becomes relatively small. However, if an analog modulated signal is input, the transmission line decoding operation becomes entirely meaningless and also bit errors per block becomes very large. Therefore, by determining whether the bit errors are relatively small or very large, it is possible to know whether a digital modulated signal or an analog modulated signal is input.

FIG. 8(B) shows a detailed arrangement for determining whether the input signal includes the digital modulated signal using a bit error rate. The demodulated output from the data identifier is supplied to an input terminal 311. The signal supplied to the input terminal 311 is then led to an output terminal 312, and also to a syndrome calculator 313. The syndrome calculator 313 is for obtaining an error pattern (syndrome) contained in a block code and is composed of, for instance, a binary code divider. The error bit position can be detected from the syndrome obtained by the binary code divider, that is, it is possible to make an error correction. However, it is sufficient here only to detect the number of bit errors. Therefore, the syndrome is supplied to an error counter 314 to detect the number of errors. The error counter 314 is realized by an ROM (read only memory) which has address inputs equal to, for instance, the number of syndrome bits and the number of output bits equal to the number of maximum errors. The output of the error counter 314 is supplied to a continuity discriminator 315 so that it is discriminated that the input signal does not include any digital modulated signal only when the large number of errors are continuously detected, in order to permit actual transmission errors to a certain extent. If the state of the large number of errors is continued, an identification flag to show that the digital modulated signal is being received is obtained from an output terminal 315. The continuity discriminator 315 can be realized by a simple counter. Further, in the explanation, it is described that the input signal includes a block encoded signal, but the input signal may include a non-block encoded signal processed by a convolution technique.

FIG. 9 shows another example of the digital modulated signal discriminator 300 which includes an arrangement for discriminating whether the input modulated signal includes the digital modulated signal by using the loop filter output of a carrier regenerating PLL circuit.

As shown in FIGS. 9(A-a) and 9(A-b), the QAM signal and the VSB-AM signal differ from each other in the spectrum shape. In the case of the digital modulated signal, as the frequency is generally scrambled, the spectrum becomes flat. Further, the carrier frequency exists at the center of the frequency band (see FIG. 9(A-a)). FIG. 9(A-b) shows the spectrum of the VSB-AM signal of an NTSC composite signal. The video carrier frequency is at a position lower than the center by 1.75 MHz. Therefore, frequencies of the QAM and the VSB-AM modulated carrier frequencies differ from each other by the 1.75 MHz. Accordingly, if the frequency error is large when inspecting the frequency error of the detected output, in other words, if the loop filter output is larger than a prescribed amount it may be better to determine that the modulated signal includes the VSB-AM signal, or if the loop filter output is smaller than the prescribed amount it may be determined to include the QAM signal.

FIG. 9(B) shows an example of the discriminator. To an input terminal of the discriminator, the loop filter output of the carrier regeneration PLL circuit is supplied. The signal is supplied to a D/A converter in the PLL circuit through an output terminal 322 and one of the terminals of a comparator 323. The comparator 323, comparing the input signal A with the reference level B, determines if A>B, that is, if the loop filter output includes a signal showing the carrier deviation of about 1.75 MHz and outputs its identification flag through an output terminal 324.

FIG. 10 shows an example of another digital modulated signal discriminator 300. The digital modulated signal discriminator 300 uses the fact that a modulated signal vector differs between the QAM and the VSB-AM signals. FIGS. 10(A-a) and 10(A-b) shows typical modulated signal vectors of the QAM signal and the VSB-AM signal, respectively. FIG. 10(A-a) shows the 16 QAM signal symbol phase wherein 16 vectors exist, while FIG. 10(A-b) shows the vector diagram representing the VSB-AM signal which is a resultant vector V+C of the vector V representing the low frequency components of the video signal with both sidebands transmitted and the vector C representing the high frequency component, e.g., the color sub-carrier component of the video signal with single sideband transmitted. Further, as carrier frequencies of two modulated signals differ from each other, the vector rotation is defined as the 0° by respective carrier frequencies. As seen from the drawing, in the case of the QAM signal the vectors of the modulated signal exist in all phase quadrants, while in the case of the VSB-AM signal the vectors of the modulated signal exist in only the first and fourth quadrants. Therefore, if vectors of the modulated signal exist in only the first and fourth quadrants when it is checked whether or not the modulated signal occurs for a fixed period of time, it may be determined that the VSB-AM signal is being received.

Figure 10A:
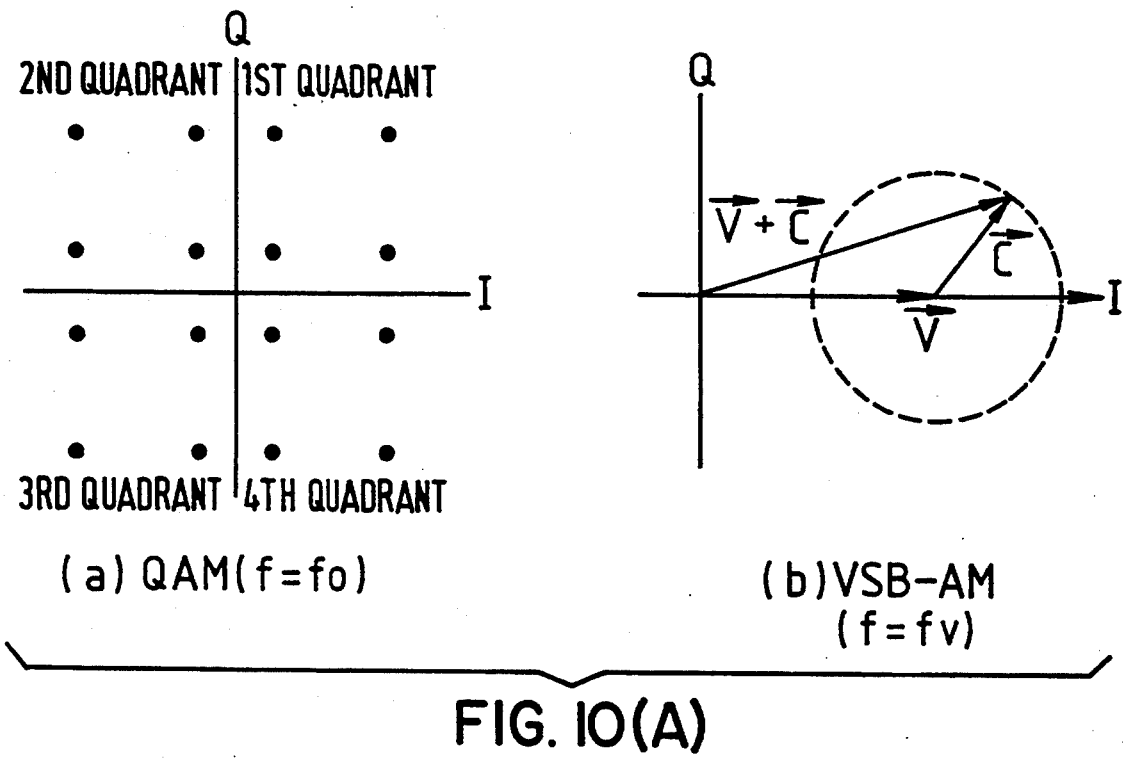
FIG. 10(A) is a diagram showing vector phases of the transmission signal modulation system according to the present invention and FIG. 10(B) is a diagram showing still another example of the digital modulation discriminator 300 in FIG. 6.
Figure 10B:
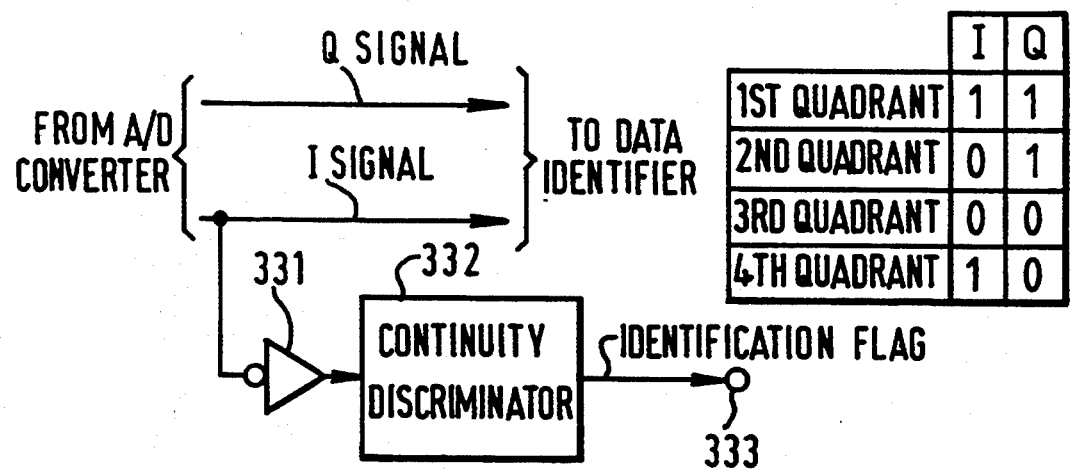

FIG. 10(B) shows the detail of the discriminator. The digital modulated signal demodulator is equipped with an in-phase detector and a quadrature-phase detector and is capable of obtaining the in-phase detection output Q and the quadrature-phase detection output I. These detection outputs Q and I are supplied to a data identifier and converted into phase detection data. In the discriminator, for instance, the detection output I is used so as to be supplied to a continuity discriminator 332 via an inverter 331.

As shown in the truth table, in the case of the QAM signal, the I signal takes the "1" value when the vector exists in the first and fourth quadrants, or takes the "0" value when the vector exists in the second and third quadrants. That is, in the case of the VSB-AM signal no vector exists in the second and third quadrants. That is, the second and the third quadrants will never takes the "1" value. Therefore, in the case of the QAM, the I signal acts as data input having the "0" and the "1" values. In the case of the VSB-AM signal, data exists continuously in the second and the third quadrants and the inverter output always takes the "0" value. So, assuming an overmodulation due to the effect of a multi-path distortion (ghost), etc., the VSB-AM signal is supplied to the continuity discriminator 332 and in other case, assuming that the QAM signal is being input, the identification flag is output through an output terminal 333. The continuity discriminator can be realized by using a counter.

Figure 11:
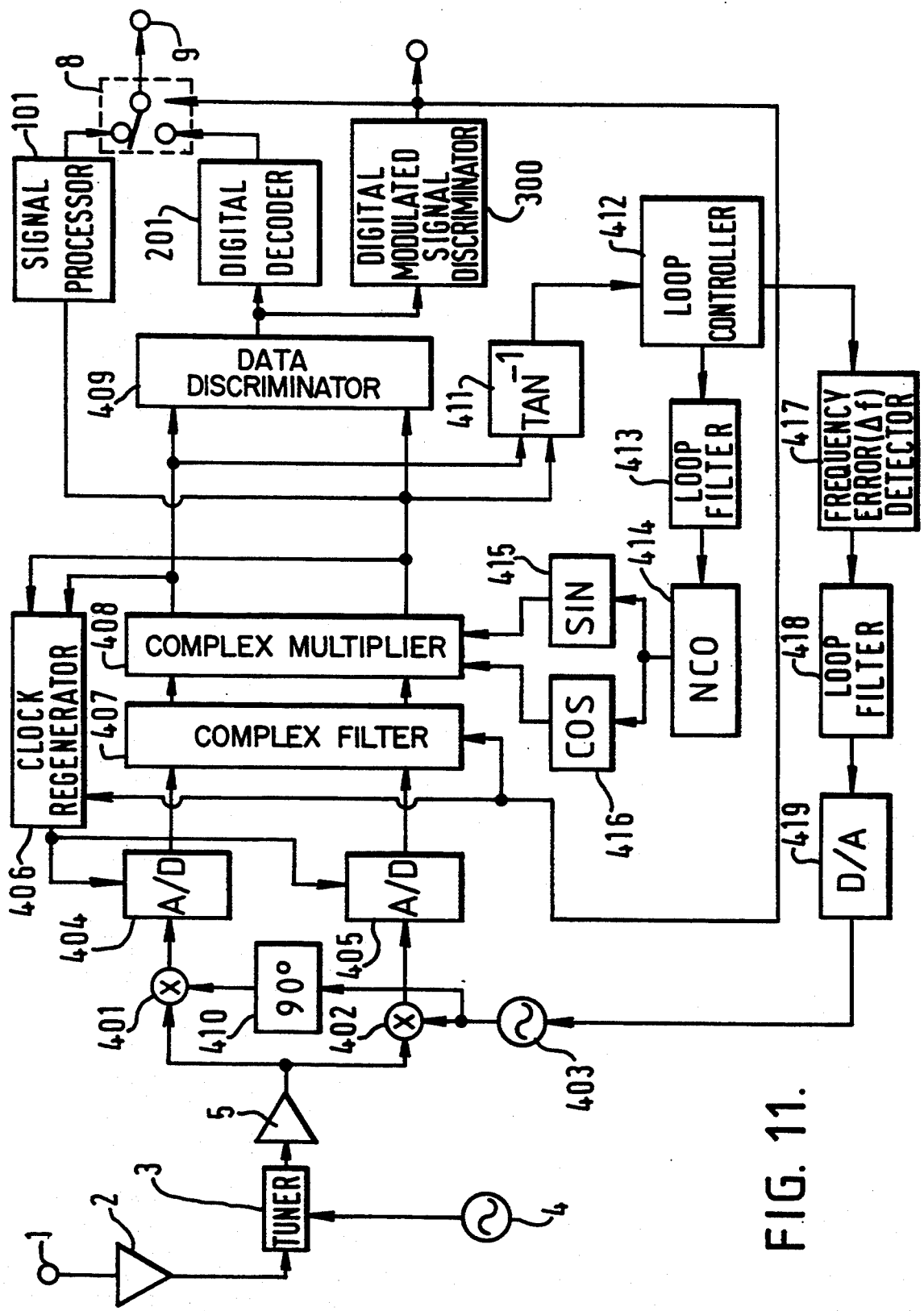
FIG. 11 is a block diagram showing a second embodiment of the receiver according to the present invention.

FIG. 11 shows a second embodiment of the receiver according to the present invention. The receiver of FIG. 11 is so designed that the signal processing mode is automatically changed over even when either the QAM or the VSB-AM signal is received and the number of common use elements is increased as many as possible to achieve at a low cost by applying the present invention. Common elements in the circuit configuration, as shown in FIG. 6, are assigned with the same numerals.

Either a specified analog or a digital modulated signal is supplied to the receiver as an input signal. The input modulated signal is input via the RF amplifier 2 to the tuner 3 where it is mixed with the oscillation output from the local oscillator 4 and then converted into an intermediate frequency (IF) signal. In this embodiment, it is not necessary to connect a frequency control loop to the local oscillator 4. The reason for the unnecessity of the frequency control loop will be described later. The IF signal is suppled to a quadrature-phase detector 401 and an in-phase detector 402 via an AGC amplifier 5. The local oscillation output from another local oscillator 403 is not only supplied directly to an in-phase detector 402 but also supplied to a quadrature-phase detector 401 via a 90° phase shifter 410. A Q signal and an I signal output from the quadrature-phase detector 401 and the in-phase detector 402 are converted into digital signals in an analog/digital (A/D) converters 404 and 405, respectively, and then input to a complex filter 407. Further, it is preferred that the input analog modulated signal is converted into a digital signla at a sampling clock of with a frequency more than two times of the signal band while the input digital modulated signal is also converted into a digital signal at a sampling clock having a symbolic center timing. For the purpose, an identification flag for identifying whether the input signal includes the analog modulated signal or the digital modulated signal is supplied to a clock regenrator 406 which provides clocks to the A/D converters 404 and 405. The identification flag is obtained from the digital modulated signal discriminator 300 that is previously described.

The Q and the I signals made very close to the baseband are digitized and then shaped their spectrum by the complex filter 407. For such digital modulated signals as the 16 QAM signal, route distributed roll-off characteristics are used, while a Nyquist filter is used for such analog modulated signals as the VSB-AM signal.

FIG. 12(A) shows the spectrum shaping characteristics for the QAM signals while FIG. 12(B) shows the spectrum shaping characteristics for the VSB-AM signals. When the spectrum shaping for the QAM signals are expected here, it is actually unnecessary to use a complex filter because the QAM signals are symmetrical for positive and negative frequencies and it is sufficient if a digital LPF having the same characteristics is used for each of the complex signals I and Q but desired characteristics can also be realized by giving an adequate coefficient of the complex filter. In the case of the VSB-AM signal, however, because the spectrum shaping characteristics of positive and negative frequencies are asymmetrical, as seen from FIG. 12(B), a complex filter that is capable of expressing negative frequency in imaginary number is required. In this embodiment circuit portions commonly usable to different kinds of input signals was realized by changing a coefficient with an identification flag obtained from the digital modulated signal discriminator 300 so that filter characteristics suited to the input signals are obtained. Further, supplied to the complex filter 407 is not a completely synchronously detected signal but frequence detuning is removed and therefore, there exists no errors between the filter characteristics and the signal frequency. The filter performance is important as it directly affects the bit error rate in the case of the digital modulated signal being input and the waveform distortion in the case of the analog modulated signal being input. The complex filter 407 can be realized at an higher accuracy than conventional analog filters (filters and SAW filters consisting of coil, transformer, capacitor, etc.) as it is composed of digital circuits.

Next, the output of the complex filter 407 is supplied to a complex multiplier 408 for carrying out a phase synchronous detection. That is, for the local oscillation supplied to the complex multiplier 408, a carrier frequency regenerated by a PLL circuit that will be described later is input. The output from the complex multiplier 408 is supplied to the clock regenerator 406, and also to a data discriminator 409. In the clock regenerator 406, a timing phase error between the clock and the data is detected, and thereby the PLL circuit for the clock regeneration is controlled.

Further, the output of the complex multiplier 408 is suppled to an arc-tangent (TAN$^{-1}$) circuit 411. The arc-tangent circuit 411 detects a phase error of the modulated signal. Here, if the input signal includes a digital modulated signal, a phase difference between the input modulated signal and the local oscillation frequency is obtained for each modulated symbol or if the input signal includes an analog modulated signal, a phase difference between the input carrier component (line spectrum) and the local oscillation frequency is obtained. The phase error signal is supplied to a loop filter 413 via a loop controller 412, and after smoothed in the loop filter 413 the smoothed signal is supplied to the frequency control input terminal of a numerical control oscillator (NCO) 414. The NCO 414 generates a so-called sawtooth wave. The smoothed wave output is supplied to a sine converter 414 having a sine characteristics and also to a cosine converter 456 having a cosine characteristics. The local oscillation outputs of the sine converter 414 and the cosine converter 415 are supplied to the complex multiplier 408 as a complex sine wave signal and a complex cosine wave signal, respectively. The loop includes a carrier regeneration PLL.

On the other hand, the output from the arc-tangent circuit 411 supplied to the loop controller 412 is further supplied to a frequency error (Δf) detector 417. The frequency error (Δf) detector 417 detects a frequency detuning by detecting the phase change rate per unit time. After smoothed in a second loop filter 418, the output of the detector 417 is converted to an analog control signal in a D/A converter 419, and then supplied to the frequency control terminal of the local oscillator 403. The loop includes an AFC loop.

The loop controller 412 is for operating the PLL and the AFC loop by changing over at certain time intervals. At the beginning of the operation of the receiver, the loop controller 412 enables the AFC loop to remove fequency error but disables the PLL. When the frequency error is determined to have become sufficiently small, the loop controller 412 stops its signal output to the AFC loop while supplies the error signal to the PLL for enabling its carrier regeneration. As a result, the frequency detuning has been removed at the time the PLL starts, thereby the phase synchronization can be achieved easily and at a high speed. Further, the complex filter 407 which has a large delay factor is not included in the carrier regeneration PLL so that the carrier regeneration characteristics (especially, phase jitter) is not deteriorated by the complex filter 407.

In this embodiment, even if a frequency detuning has occurred in the IF signal the frequency detuning can be removed in the demodulator as described above. Thus it is unnecessary to use frequency control for local oscillation signal like in the conventional analog modulated signal tuning method, and therefore elements relative to the portion are simplified and made highly efficient.

The output of the complex multiplier 408 is supplied to both the data discrimator 409 and the signal processor 101. The data discrimator 409 includes a symbol decoder for the digital modulation. The data discrimator 409 discrimates digital modulated signal data from the I and Q signals and supplies the detected signal to both the digital decoder 201 and the digital modulated signal discrimator 300. In the digital decoder 201 high efficiency coded video signals, etc. are decoded.

When the analog modulated signal, i.e, the VSB-AM signal is input to the receiver, a synchronous detection output is obtained as the I signal (at the I axis side). This is clearly seen from the spectrum as illustrated in FIG. 10(A). So, it si enough to lead the I signal to the signal processor 101 for such signal processing as DC regeneration, etc. The outputs of the signal processor 101 and the digital decoder 201 are led to the switch 8, and thus an adequate demodulated output is selected by the switch 8 as illustrated in FIG. 6.

As described above, the above embodiment associated with different modulation systems does not simply includes two demodulators, but carried out two demodulation functions by sharing a common circuit. Further, all components after the A/D converter are easily digitized and they are suited for realizing a stabilized performance, a high accuracy, and an integration of circuits. In other words, low cost receivers can be obtained through the achievement of the high efficiency, the reduction of circuit elements and the adjustment-free performance.

Figure 13:
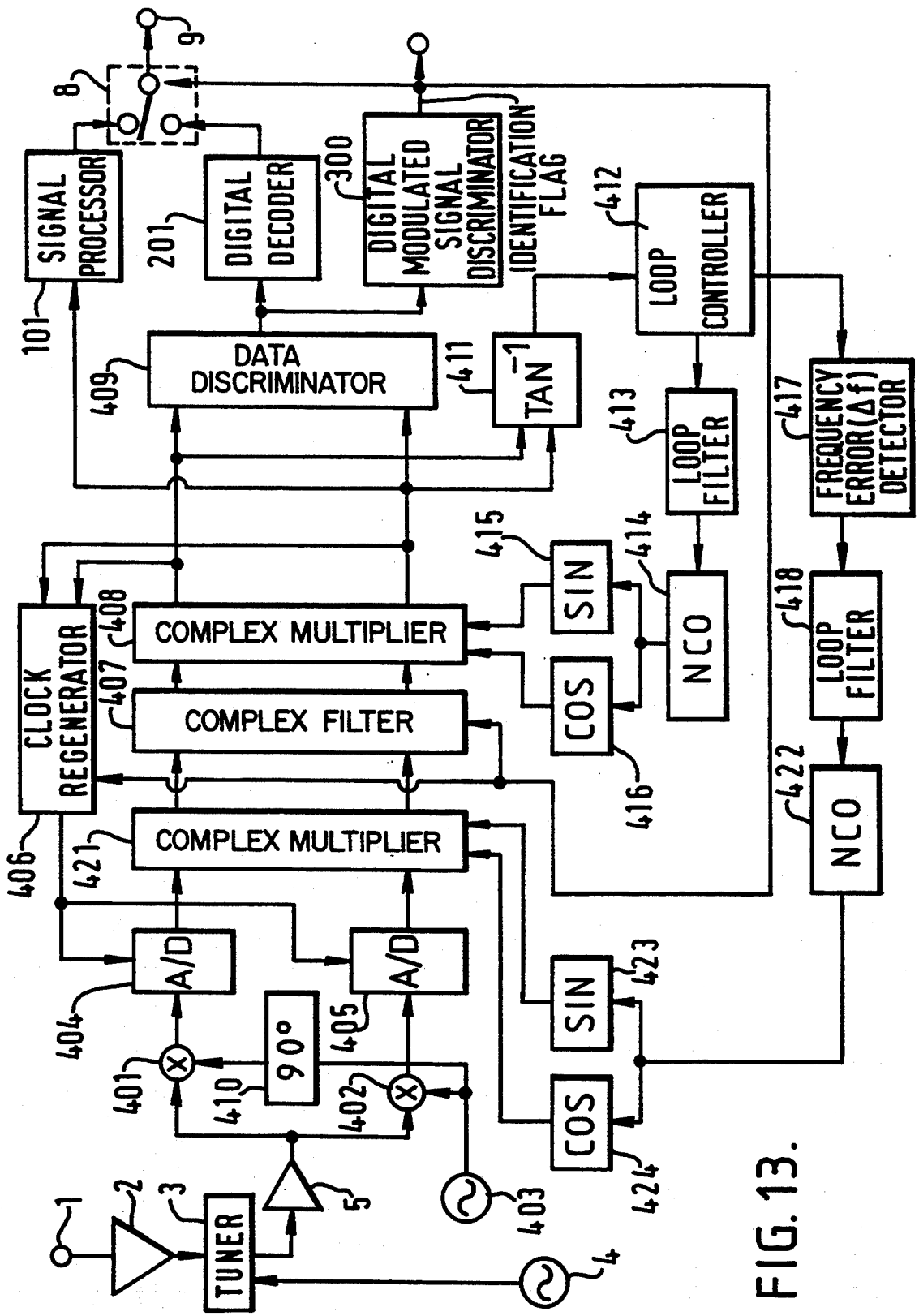
FIG. 13 is a block diagram showing a third embodiment of the receiver according to the present invention.

FIG. 13 shows a third embodiment of the receiver according to the present invention. The same numerals are assigned to the same elements of the embodiment, as shown in FIG. 11 so that their explanation will be omitted. What is different from the preceding embodiment is that a complex multiplier 421 is provided between the A/D converters 404, 405 and the complex filter 407, and that the output of the Δf detector 417 which forms the AFC loop is supplied to the frequency control terminal of a numerical control oscillator (NCO) 422 via the loop filter 418 and an output of the NCO 422 is converted into complex signals in a sine converter 423 and a cosine converter 424 and then the complex signals are supplied to the complex multiplier 421. In the case of this embodiment, the AFC loop does not act on the local oscillator 403 which is used for the quadrature-phase detector and the in-phase detector. In this embodiment, the AFC loop including the complex multiplier 421, etc. functions as a frequency converter for removing the frequency detuning.

In the preceding embodiment, the frequency output of the local oscillator 403 is controlled in order to remove the frequency detuning. The local oscillator 403 is subjected to generate a relatively high frequency signal, thus the local oscillator 403 can include an analog circuit using variable capacitance diodes, etc. When the frequency variable range of such an oscillator is expanded, the frequency stability of its oscillation output is generally deteriorated. This embodiment, therefore, provides a stabilized local oscillator which obtains a fixed oscillation output signal by using digital circuits, in place of varying the oscillation frequency by using analog circuits.

As described above, the above embodiments are widely digitalized in its circuit construction to facilitate a higher stabilization, an increased accuracy, and an integration of circuits, thereby realizing a higher efficency and a low cost for the receiver.

As described above, the embodiments of the receiver according to the present invention, adapted for receiving the broadcasting and the transmission systems where analog and digital modulation signals are present in the mixed state, are capable of automatically discriminating the modulation type of the received signal and also capable of automatically changing over to an adequate mode regardless of the modulation type of the received signal. Thus the embodiments are very convenient to use. Further, in these embodiments a demodulator is commonly used for demodulating both the analog and the digital modulated signals. Thus the receiver can be provided at a low cost. Further, the receiver is very advantageous in industrial fields.

In the embodiments, the QAM signal and the VSB-Am signal are expected as the digital modulated signal and the analog modulated signal, respectively. However, not limited to these signals, the FM signal ahd QPSK modulated signal are also transmitted as an analog signal and as a digital modulated signal, respectively, thus they often present in the mixed state in some cases.

Figure 14:
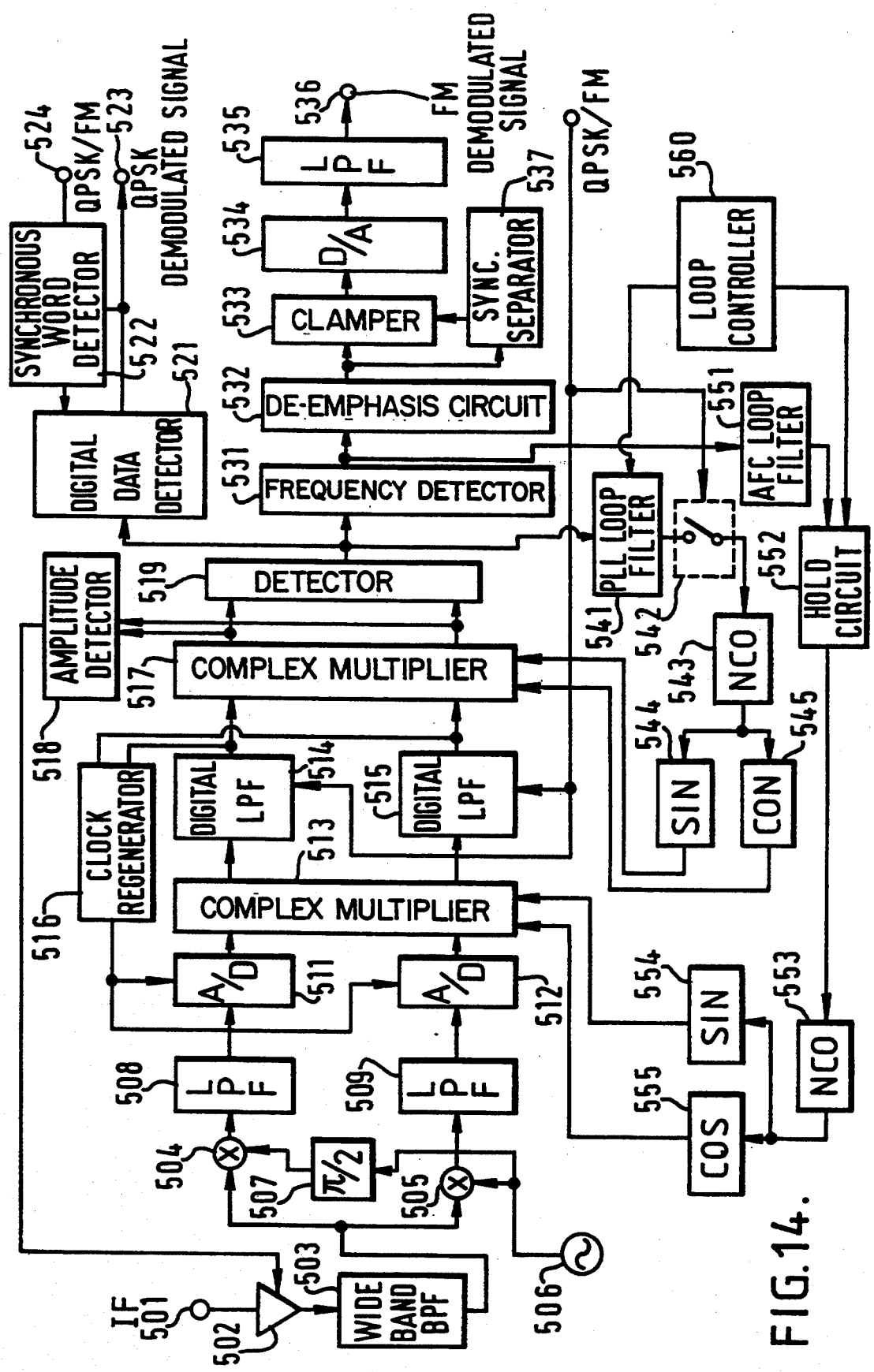
FIG. 14 is a block diagram showing a fourth embodiment of the receiver according to the present invention.

FIG. 14 shows a fourth embodiment of the receiver according to the present invention. In the receiver of FIG. 14 different modulated signals are discriminated if they are present in the mixed state and a signal processing mode is automatically changed over to an adequate mode. Further, in this embodiment, common circuits are increased as many as possible to reduce the cost of the receiver.

The QPSK demodulated signal or the FM signal supplied to an input terminal 501 is controlled its gain an an AGC amplifier 502 and then supplied to a wide band BPF 503. To the control terminal of the AGC amplifier 502, a gain control signal is supplied from an amplifier detector 518. The signal is removed noises thereform at the wide band BPF 503, and then supplied to both a quadrature-phase detector 504 and an in-phase detector 505. A local oscillation signal from a local oscillator 506 is supplied to the quadrature-phase detector 504 via a 90° phase shifter 507 while the local oscillation signal from the local oscillator 506 is also supplied directly to the in-phase detector 505. The phase detection outputs from the detectors 504 and 505 are supplied to the low-pass filters (LPF 508 and 509. After removed high frequency components at the PLFs 508 and 509, the phase detection outputs are supplied to A/D converters 511 and 512, respectively, and then digitized therein.

The digitized signals are supplied to a complex multiplier 513 for implementing frequency conversions. A local oscillation signal from an AFC loop which will be described later is supplied to the complex multiplier 513 as a frequency conversion carrier. The frequency conversion outputs from the complex multiplier 513 are supplied to digital low-pass filter (digital LPF) 514 and 515 having the same frequency transfer characteristics, respectively.

These digital LPFs 514 and 515 are provided with a QPSK/FM change-over signal, as described later. The digital LPFs 514 and 515 operate as filters for removing high frequency components from their input signals if the input signals include the FM signal. While if the input signals include the QPSK modulated signal, they operate as filters for providing transfer characteristics required for preventing an inter-symbol interference in the digital data transmission. The filters in this case are generally so designed that so-called roll-off characteristics in conjunction with transmission side filter characteristics. Therefore, in the outputs of the digital lPFs 514 and 515, detection outputs are shaped their spectrum so that each eye opening rate of the detection outputs has a sufficiently large value.

The outputs of the digital LPFs 514 and 515 are supplied to a clock regenerator 516. The clock regenerator 516 regenerates a sampling clock to be used for the A/D converters 511 and 512, and in particular selectively regenerates either a clock for the QPSK modulated signal or a clock for the FM signal by the QPSK/FM change-over signal as described later, according to the type of the input modulated signal. If the input signal includes the QPSK modulated signal, symbol timing components are extracted from the input signal. Then a timing clock at the center of the symbol is supplied to the AD converters 511 and 512. Further, if the input signal includes the FM signal, a clock having a frequency of more than two times the frequency bandwidth of the input signal is supplied to the A/D converters 511 and 512.

The outputs of the digital LPFs 514 and 515 thus removed the high frequency components are supplied to a complex multiplier 517. The complex multiplier 517 is capable of performing a frequency conversion at the base band entirely the same operation as that of the frequency converter at the intermediate frequency band, that is, the mixer. The reason for using such a complex multiplier is that in a multiplication using real numbers without using complex numbers, a detecting operation can be obtained but no negative frequency components can be expessed and it does not become a general frequency converter. When such a complex multiplier is used, negative frequency components can be treated as imaginary numbers. The output of the complex multiplier 517 is supplied to an amplitude detector 518 for detecting amplitudes. The amplitude information is used as gain control information for the AGC amplifier 502 as describe before. Further, the outputs of the complex multiplier 517 are supplied to a phase detector 519. In the phase detector 519, phase errors between its inputs and the QPSK symbol is de-tected. The phase error information output from the phase detector 519 is supplied to a digital data detector 521. If the IF signal includes the QPSK modulated signal, the digital data detector 521 demodulates the QPSK data, by using the phase error information and phase correction signal from a synchronous word detector 522 which will be described later. The demodulated data from the QPSK modulated signal is then output through an output termianl 523. Further, the demodulated data is supplied to the synchronous word detector 522. The synchronous word detector 522 detects synchronous words from the demodulated data and then provides a phase correction signal to the digital data detector 521.

Figure 15:
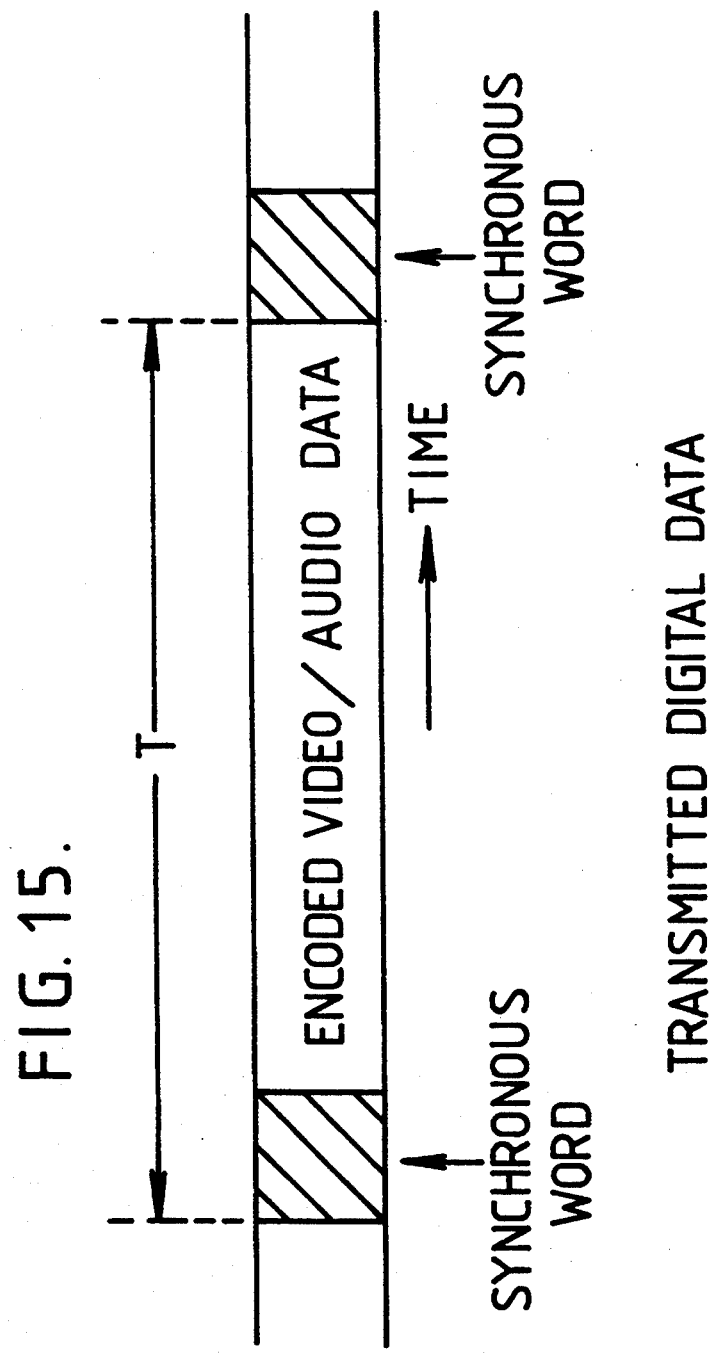
FIG. 15 is a diagram showing another example of the transmission signal format according to the fourth embodiment of the receiver.

FIG. 15 shows the state where a synchronous word (i.e., a data having a less correlation with other data) is inserted periodically (at a point T) into a digital coded video data sequence or an audio data sequence. If the synchronous word is detected in the synchronous word detector 522, it indicates that the QPSK demodulated signal is being received and an identification flag showing that the QPSK demodulated signal is being received is output through an output terminal 524. If no synchronous word detection is detected, an identification flag showing that the FM signal is being received is output through the output terminal 524. By the identification flag, the filter characteristics of the previously described digital LPFs are changed over to characteristics adapted to the modulated signal being received, and further the clock frequency of a clock regenerator 516 is also changed over. Furthermore, the operation of a PLL circuit which will be described later is also changed over.

The output having phase error information from the phase detector 519 is supplied to a PLL loop filter 541 for a carrier generation. The output of the PLL loop filter 541 is supplied to the frequency control terminal of a numerical control oscillator (NCO) 543 via a siwtch 542. The switch 542 is so controlled that the switch 542 is kept ON while the QPSK demodulated signal is being received, while it is kept OFF when the FM signal is being received. The numerical control oscillator 543 includes a cumulative adder which does not inhibit overflow and becomes the oscillating state in order to perform the adding operation up to its dynamic range according to a signal being supplied to its frequency control terminal and its oscillation frequency is changed by a control signal value. That is, the numerical control oscillator 543 operates in the entirely same manner as a voltage control oscillator (VCO) in an analog circuit. The numerical control oscillator 543 differs from a general VCO (voltage controlled oscillator) in that its oscillation frequency is very stable, and its features the stability higher than a VCXO (voltage controlled crystal oscillator) installing so-called crystals and a wide frequency variable range that cannot be realized by the VCXO. The output of the numerical control oscillator 543 is supplied to a sine converter 544 and a cosine converter 545 of which data conversion characterisicts are sine and cosine characteristics, respectively. The outputs of the sine converter 544 and the cosine converter 545 are supplied to the complex multiplier 517. The loop includes a phase locked loop of completely digital configuration. If a circuit having a complete integral system is contained in the PLL loop filter 541, the PLL frequency lock range is infinite as the principle and the ideal operation of a PLL can be realized. Here, the PLL loop filter 541 is turned ON or OFF by an output (AFC/PLL change-over signal) from a loop controller 560.

The loop controller 560 is able to change over the PLL operation and the AFC loop operation which will be described later.

Next, the AFC loop will be described. The output (phase error information) of the phase detector 519 is supplied to a frequency detector 531. The frequency detector 531 detects a frequency component (i.e., FM signal) by detecting phase changes per unit time. The frequency component is supplied to an AFC loop filter 551 and a de-emphasis circuit 532. The output of the AFC loop filter 551 is supplied to the frequency control terminal of a numerical control oscillator (NCO) 553 via a hold circuit 552. The output of the numerical control oscillator 553 is supplied to a sine converter 554 and a cosine converter 555 of which data conversion characteristics are sine and cosine characteristics, respectively. The outputs of the sine and cosine converters 554 and 555 are supplied to the complex multiplier 513. The hold circuit 552 is controlled by the AFC/PLL change-over signal from the loop controller 560 and permits the output of the AFC loop filter 551 to pass through if the AFC loop is selected and holds the signal being supplied from the AFC loop filter 551 if the PLL is selected. The loop controller 560 is designed to select the AFC loop for a certain time from, for instance, the time of the channel selection and thereafter, select the PLL.

The output (frequency component) of the frequency detector 531 is supplied to the de-emphasis circuit 532. The de-emphasis circuit 532 includes a circuit that has a characteristics contrary to a pre-emphasis performed at the transmitter side and by attenuating high frequency components, restores the received signal to the signal having an original flat frequency characteristics. The output of the de-emphasis circuit 532 is supplied to a clamper 533 and a sync separator 537. The sync separator 537 separates sync signal from input signal and based on the sync signal, provides clamp pulse to the clamper 533. Thus, DC regeneration is carried out in the clamper 533 and the DC regenerated FM demodulated signal is converted to analog signal in a D/A converter 534 and is led to an FM demodulated signal output terminal 536.

According to the embodiments described above, if the FM signal and the QPSK modulated signal are present in the mixed state in the satellite transmission or the satellite broadcasting, signals of both modulation systems can be demodulated. Further, it is possible to change over the system to the operating state adapted to demodulate modulated signal by automatically discriminating which one of the FM signal or the QPSK modulated signal is being received.

As described above, the present invention can provide an extremely preferable receiver adaptively operable for multiple signal transmission systems.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A receiver for receiving high frequency signals including analog modulated high frequency signals and digital modulated high frequency signals, the receiver comprising:

converting means for selecting a channel of the received high frequency signals and for converting the high frequency signals in the selected channel into intermediate frequency signals;

demodulating means for demodulating the intermediate frequency signals, the demodulating means including a first demodulation system for demodulating intermediate frequency signals corresponding to the analog modulated high frequency signals and a second demodulation system for demodulating the intermediate frequency signals corresponding to the digital modulated high frequency signals and selectively outputting an output signal demodulated in one of the first demodulation system or the second demodulation system based on a control signal;

control means for outputting the control signal based on a signal provided to the control means by the second demodulation system, the control signal indicative of whether the high frequency signals in the signal channel are analog modulated high frequency signals or digital modulated high frequency signals; and a selectively closable frequency control loop including an oscillator providing an oscillating signal to the converting means, the frequency control loop being selectively closed based on the control signal provided by the control means, the frequency of the oscillator being controlled when the frequency control loop is closed.

2. A receiver as defined in claim 1, wherein the frequency control loop includes a frequency error detector receiving the intermediate signal output from the converting means and a switch actuated by the control signal, the switch selectively connecting an output of the frequency error detector to the oscillator thereby closing the frequency control loop and controlling the frequency of the oscillator.

3. A receiver as defined in claim 1, wherein the signal demodulated in the second demodulation system includes a synchronous word which is multiplexed in digital modulated high frequency signals in advance.

4. A receiver as defined in claim 1, wherein the signal demodulated in the second demodulation system includes information indicating a transmission error state occurring in the second demodulation system for decoding a transmission path encoding data which is multiplexed in the digital modulated high frequency signals in advance.

5. A receiver as defined in claim 1, wherein the signal demodulated in the second demodulation system includes information indicating an operate state of a carrier regenerator for performing a synchronous detection.

6. A receiver as defined in claim 1, wherein the converting means comprises:

a first amplifier having a first amplifier input and a first amplifier output;

a tuner having a first tuner input and a second tuner input and a first tuner output, the first tuner input coupled to the first amplifier output and the second tuner input coupled to the oscillator; and a second amplifier having a second amplifier input and a second amplifier output, the second amplifier input coupled to the first tuner output and the second amplifier output coupled to the demodulation means.

7. A receiver as defined in claim 6, wherein the analog modulated high frequency signals include a VSB-AM signal and the digital modulated high frequency signals include a QAM signal.

8. A receiver as defined in claim 7, further comprising:

frequency conversion means for converting the intermediate frequency signal into a complex baseband signal; and means for performing one of (1) a spectrum shaping using a complex Nyquist filter and VSB-AM synchronous detection when the complex baseband signal corresponds to a VSB-AM demodulated signal or (2) a prescribed spectrum shaping and a quadrature-phase synchronous detection when the complex baseband signal corresponds to a QAM demodulated signal.

9. A receiver as defined in claim 6, wherein the high frequency signals demodulated in the first demodulation system includes an FM modulated signal and the high frequency signals demodulated in the second demodulation system includes a QPSK signal.

10. A receiver as defined in claim 9, further comprising:

means for converting the intermediate frequency signal into a complex baseband signal;

means for demodulating in phase the complex baseband signal responsive to the QPSK modulated signal; and means for demodulating the intermediate frequency signal responsive to the FM modulated signal by calculating a time difference of the demodulated signal in phase.

* * * * *